United States Patent
Yuval et al.

(10) Patent No.: US 7,330,864 B2
(45) Date of Patent: Feb. 12, 2008

(54) SYSTEM AND METHOD FOR USING NATIVE FLOATING POINT MICROPROCESSOR INSTRUCTIONS TO MANIPULATE 16-BIT FLOATING POINT DATA REPRESENTATIONS

(75) Inventors: Gideon A. Yuval, Mercer Island, WA (US); Nicholas P. Wilt, Seattle, WA (US); James F. Blinn, Bellevue, WA (US); Michael D. Stokes, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 1016 days.

(21) Appl. No.: 09/797,937

(22) Filed: Mar. 1, 2001

(65) Prior Publication Data

US 2002/0184282 A1    Dec. 5, 2002

(51) Int. Cl.
G06F 7/00    (2006.01)
G06F 7/38    (2006.01)

(52) U.S. Cl. .................... 708/208; 708/495

(58) Field of Classification Search ........... 708/204, 708/495, 208
See application file for complete search history.

(56) References Cited

U.S. PATENT DOCUMENTS

| | | | | |
|---|---|---|---|---|
| 5,768,169 A * | 6/1998 | Sharangpani | ............ | 708/204 |
| 6,105,047 A * | 8/2000 | Sharangpani et al. | ....... | 708/495 |
| 6,175,907 B1 * | 1/2001 | Elliott et al. | ............. | 708/500 |
| 6,487,653 B1 * | 11/2002 | Oberman et al. | .......... | 708/508 |
| 6,571,328 B2 * | 5/2003 | Liao et al. | ................. | 712/35 |
| 6,601,079 B1 * | 7/2003 | Phillips | .................... | 708/495 |
| 6,631,391 B1 * | 10/2003 | Inabata et al. | ............. | 708/495 |
| 6,631,392 B1 * | 10/2003 | Jiang et al. | ................ | 708/498 |
| 2002/0116431 A1 * | 8/2002 | Ho et al. | ................... | 708/502 |
| 2003/0005015 A1 * | 1/2003 | Chen | ........................ | 708/520 |

OTHER PUBLICATIONS

Carmack, J., Project: Quake 3 Arena, Apr. 29, 2000, 12 pages (http://www.bluesnews.com/cgi-bin/finger.pl?id=1&time=20000429013039).
Eldon, J., "A 22-bit floating point registered arithmetic logic unit," *Proceedings of ICASSP 83. IEEE Int'l Conf on Acoustics, Speech and Signal Processing*, Apr. 14-16, 1983, Boston, Massachusetts, pp. 943-946.
Sato, Y et al., "Multi-pulse CODEC using float point signal processor," *NEC Res. Devel.*, 1998, 90 62-69.
Seidel, P.M., "High-speed redundant reciprocal approximation," *Integration—The VLSI Journal*, 1999, 28(11), 1-12.

* cited by examiner

*Primary Examiner*—Tan V. Mai
(74) *Attorney, Agent, or Firm*—Woodcock Washburn LLP

(57) ABSTRACT

A method for providing a 16-bit floating point data representation where the 16-bit floating point data representation may be operated upon by a microprocessors native floating point instruction set. The method contemplates the use a variety of techniques for converting the 16-bit floating point number into a representative native floating point value. Thereafter, the native microprocessor floating point instruction set may perform operations upon the converted data. Upon completion, the native floating point data representation may be converted back into the 16-bit floating point value.

103 Claims, 8 Drawing Sheets

SYSTEM AND METHOD FOR USING NATIVE FLOATING POINT MICROPROCESSOR INSTRUCTIONS TO MANIPULATE 16-BIT FLOATING POINT DATA REPRESENTATIONS

FIELD OF THE INVENTION

The present invention relates generally to the field of computing. More particularly, the invention relates to a system and method for establishing a 16-bit floating point format and performing floating point operations using a processors native floating point instructions.

BACKGROUND OF THE INVENTION

For regular data like pixel values, displacement maps, texture coordinates, and other possible inputs to computer graphics algorithms, good performance demands tradeoffs between size, precision, and dynamic range. Compact data representations may not have enough precision to achieve the desired quality in the final output. Data representations that require more space can represent more values, but they increase bandwidth requirements and reduce performance. The most popular ordered data representations in contemporary graphics subsystems use 8 bits or 32 bits per element of data.

8-bit elements typically contain color components, displacement (height) factors, or other components of image-like data structures that serve as inputs to the texture mapping engine or outputs of the rasterization pipeline. Usually these 8-bit values are treated as fixed-point values that have been scaled by 1/255, so 0 corresponds to 0.0 and 255 corresponds to 1.0. When used as color components, 8-bit values do not have enough precision to encompass the gamuts of a variety of imaging input devices such as scanners and digital cameras and output devices such as printers, cathode ray tubes, and liquid crystal displays (LCDs). 8 bits also lacks the precision needed to contain intermediate results of multipass imaging algorithms.

32-bit values are typically standard IEEE floating point values, with a sign bit, 8 bits of exponent, and 23 bits of fraction. These values are used to represent spatial coordinates, texture coordinates, and other inputs to the transform and lighting or rasterization pipelines. 32-bit components are too large to be used in bandwidth-intensive portions of the rendering pipeline such as the texture mapping or alpha blending units. In any case, they often have more precision than is needed for these applications, making it difficult to justify the hardware cost of 32-bit support.

SUMMARY OF THE INVENTION

In view of the foregoing, there is a need for a system that overcomes the drawbacks of the prior art. The present invention addresses these shortcomings by providing 16-bit floating point formats and conversions from that format to a floating point format native to a microprocessor, such as 32-bit floating point.

The present invention provides a solution that uses a 16-bit data representation that provides an excellent tradeoff between the 8-bit and 32-bit representations while providing precision and dynamic range. Moreover, the invention provides for the conversion between 16-bit floating point and 32-bit floating point. As a result, sufficient precision is provided by the 16-bit representation while reducing bandwidth while the conversion to 32-bit floating point allows the use of 32-bit floating point operations native to many contemporary microprocessors.

Conversions from the native floating point values into 16-bit floating point values must properly convert a sign, exponent, and significand of the native floating point value into a corresponding 16-bit floating point representation. Conversion of the sign is rather straight forward. The sign bit may be simply copied over to the 16-bit floating point representation. As for the magnitude of the number, the native floating point should map to the 16-bit floating point value that is closest to the native floating point value. Hence, the native floating point number is "rounded" to the nearest 16-bit floating point value. This may be accomplished by considering four ranges of the native floating point values. First, ranges above the maximum representable 16-bit floating point value are generally treated as infinite and clamped to a value representing infinity in the 16-bit floating point representation. Second, values that round to below the smallest 16-bit floating point representation may be clamped. Third, values must be rounded for normalized or denormalized 16-bit floating point values.

For normal 16-bit floating point values, the exponent must be rebiased, the significand must be rounded to the proper number of bits, and the new exponent and significand must be packed into 15 bits. Rebiasing may be accomplished by subtracting a constant from the exponent. Rounding may be done by either rounding to the nearest number or rounding to the nearest even number. Shifting of the fraction can be accomplished by either a fixed integer shift amount or by floating point multiplication by the appropriate power of two that scales the value of the minimum representable 16-bit floating point value to the minimum nonzero native floating point value.

For denormal 16-bit floating point values, the conversion can be done using either floating point or integer arithmetic. The integer technique involves explicitly setting the bit above the highest significand bit and shifting the resulting significand (plus the explicit 1 bit) to the right by an appropriate amount. A rounding bias may be added to this bit pattern. This addition of rounding bias may be handled by at least two different techniques. The bits can be shifted to get the significand into the position of a normal fraction and a constant bias can then be added. Thereafter, the significand may be shifted into the final position. Alternatively, the bias may be added and then the bits may be shifted into the proper position for the significand. Floating point denormalization may be accomplished by multiplying by an appropriate power of two to calculate the denormalized significand as an integer. Thereafter, a float to integer conversion may be performed.

BRIEF DESCRIPTION OF THE DRAWINGS

The foregoing summary, as well as the following detailed description of preferred embodiments, is better understood when read in conjunction with the appended drawings. For the purpose of illustrating the invention, there is shown in the drawings exemplary constructions of the invention; however, the invention is not limited to the specific methods and instrumentalities disclosed. In the drawings.

DETAILED DESCRIPTION OF THE INVENTION

Computing Environment

Figure 1:
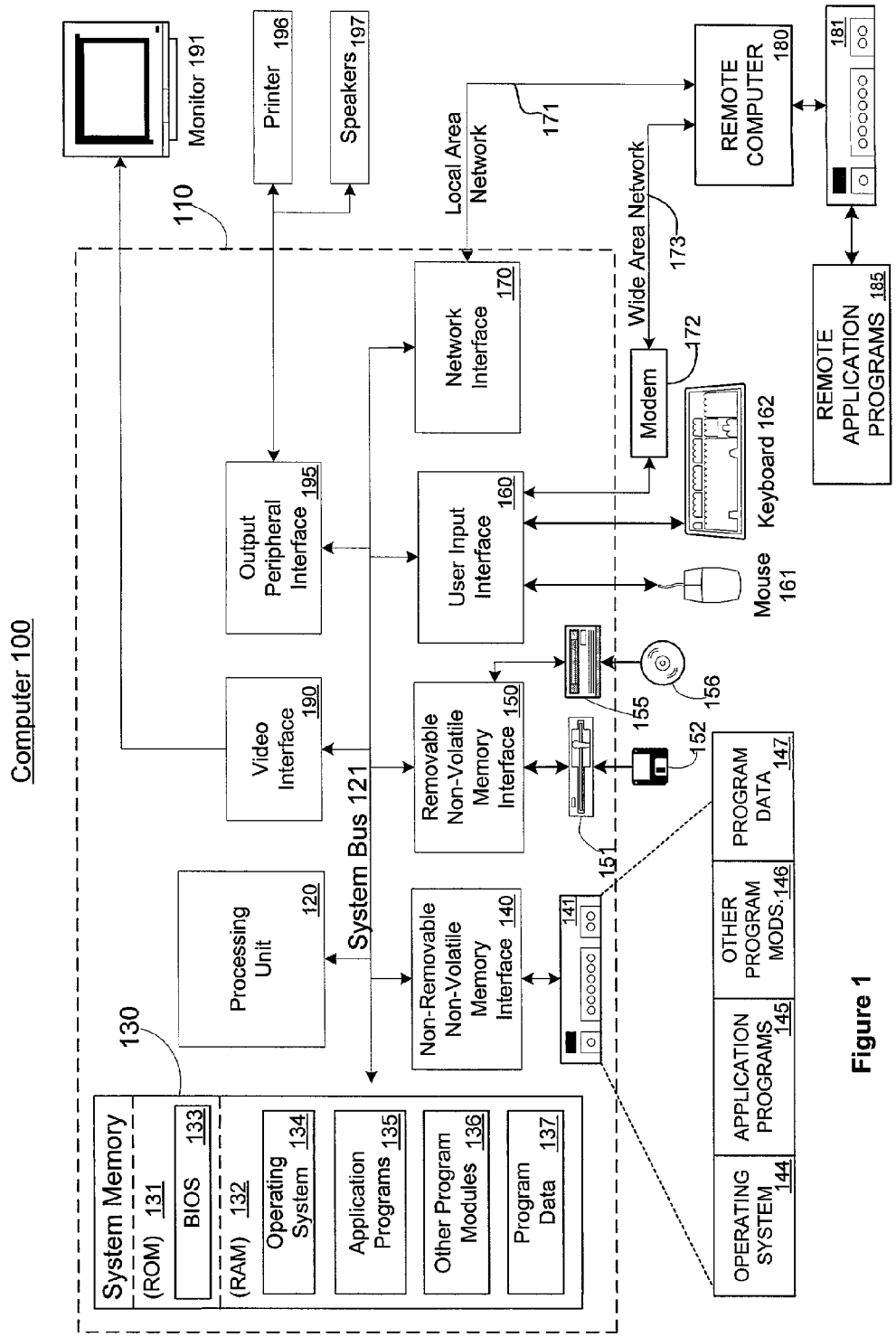
FIG. 1 a block diagram of an exemplary computing environment in which aspects of the invention may be implemented.

FIG. 1 illustrates an example of a suitable computing system environment 100 in which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network or other data transmission medium. In a distributed computing environment, program modules and other data may be located in both local and remote computer storage media including memory storage devices.

With reference to FIG. 1, an exemplary system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (CA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

Figure 6:
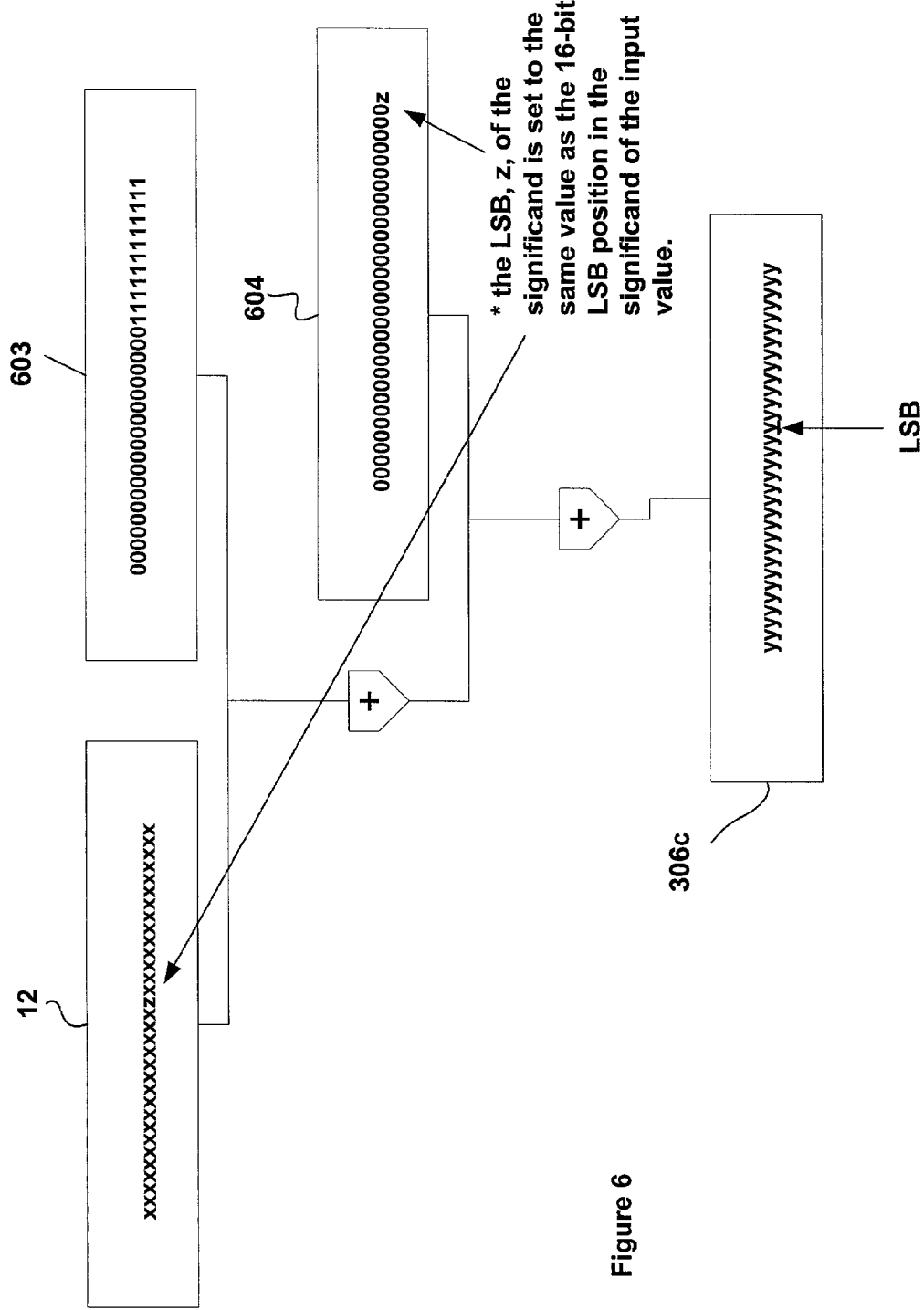
FIG. 6 illustrates a conversion from 32-bit floating to 16-bit floating point in accordance with the invention.

The computer 110 may also include other removable/non-removable, volatile/nonvolatile computer storage media. By way of example only, FIG. 6 illustrates a hard disk drive 140 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through an non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 20 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 190.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 1. The logical connections depicted in FIG. 1 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

System Context

Figure 2A:
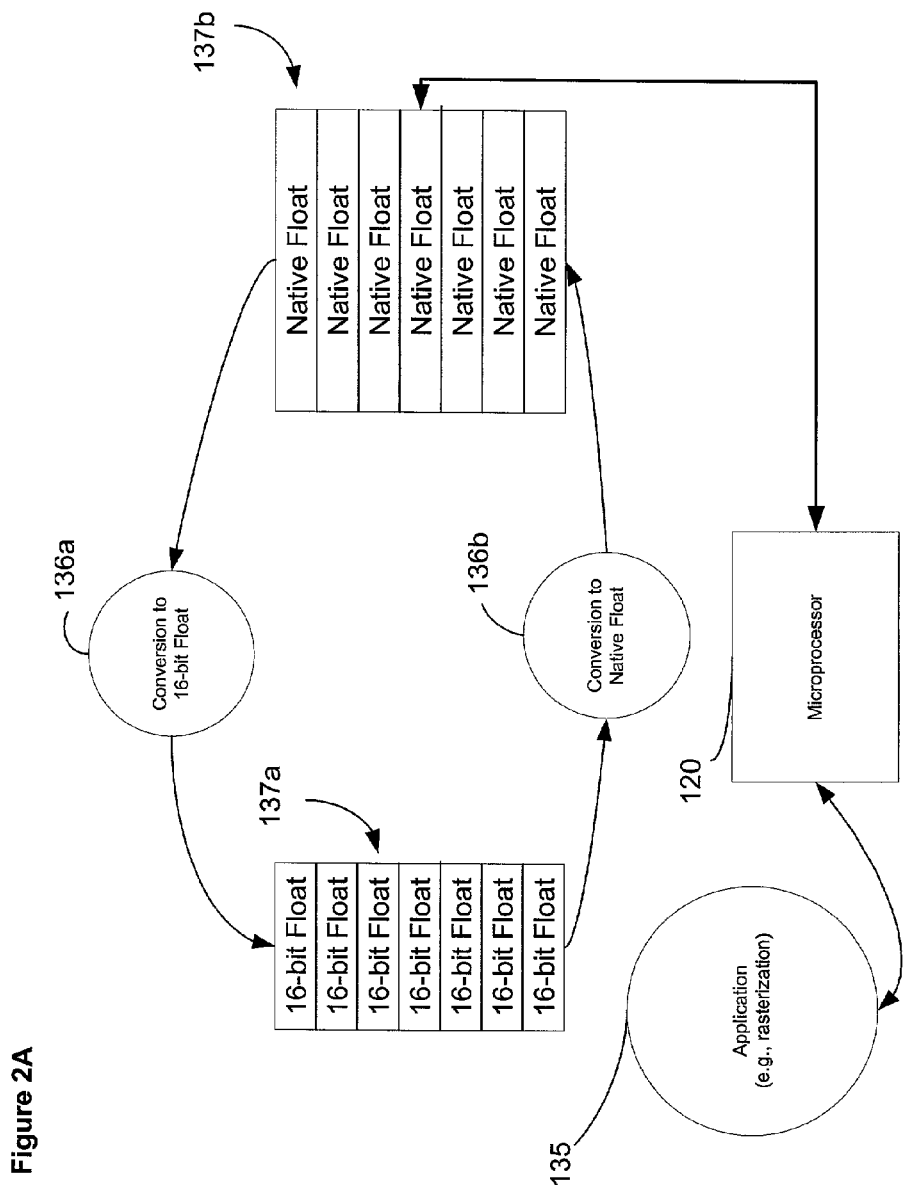
FIGS. 2A-2C are context diagrams of conversions between 16-bit and native floating point in accordance with the present invention.
Figure 2B:
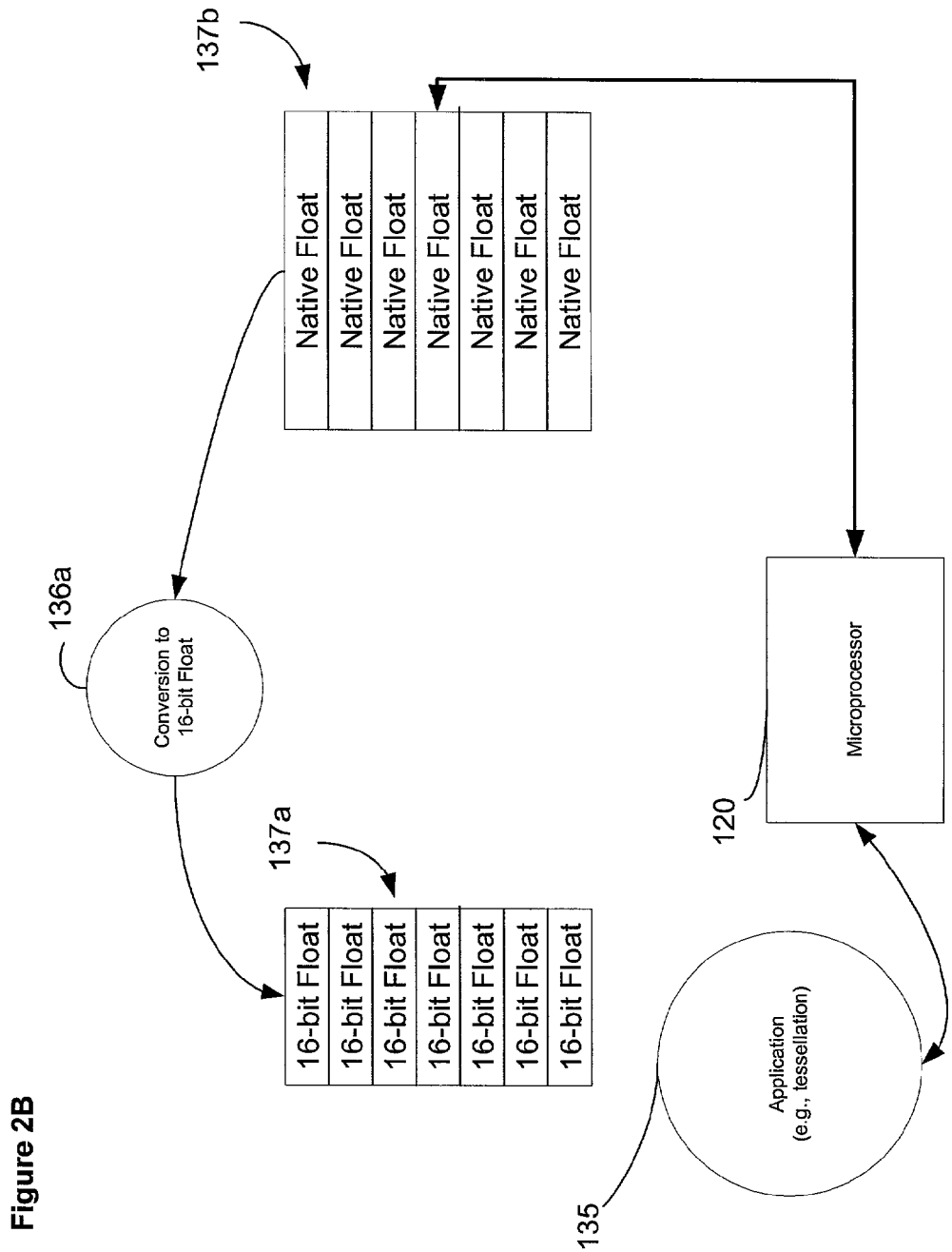
Figure 2C:
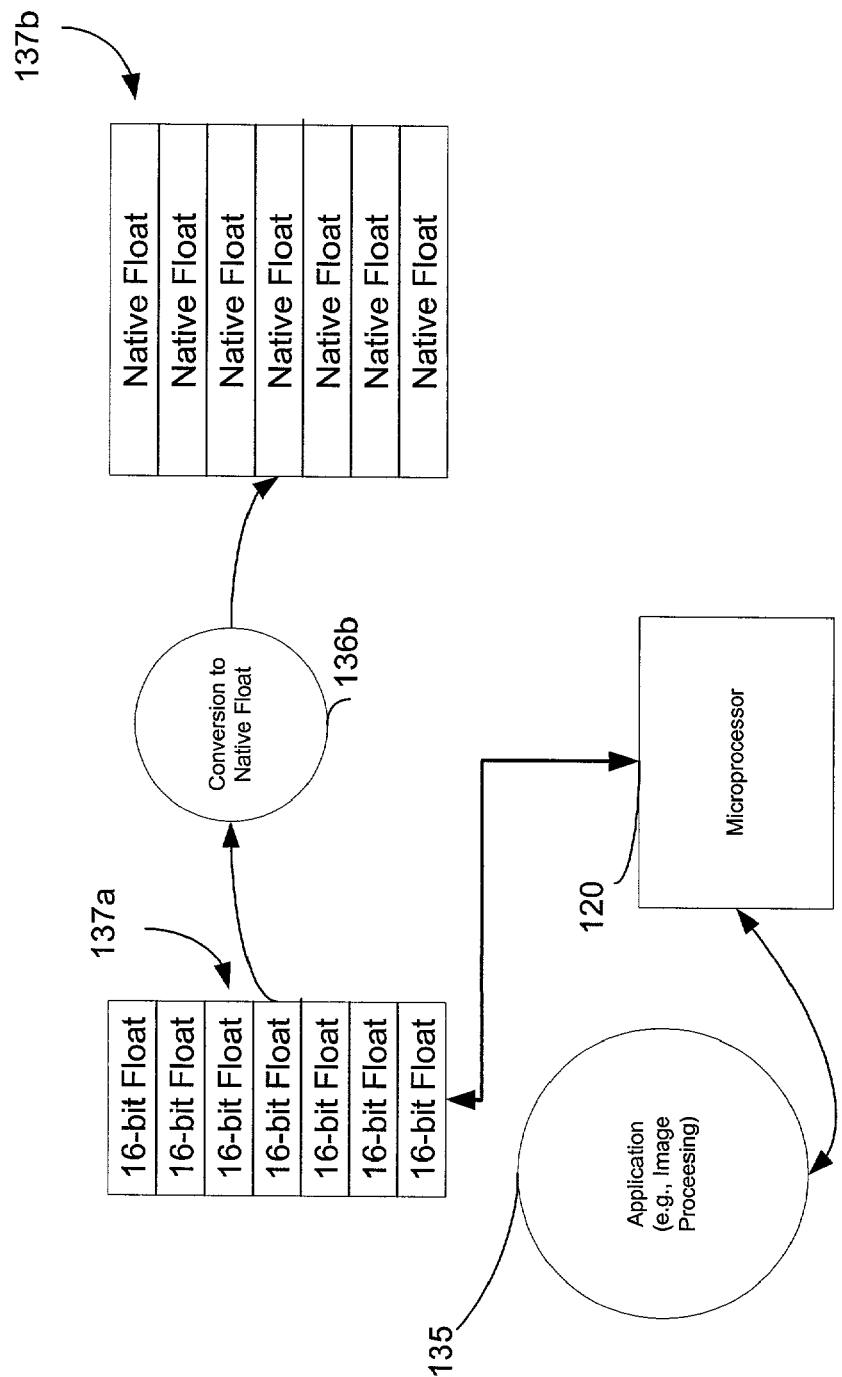

FIGS. 2A-2C illustrates the context for present invention. FIG. 2A illustrates a system wherein conversions are made to and from 16-bit floating point representations and native floating point representations. An application program 135 wishes to operate on data in 16-bit floating point format in accordance with an aspect of the present invention. For example, application program 135 may be an image processing program that generates or operates upon color information, texture mapping data, etc. Native processor 120 may not support 16-bit floating point operations but another floating point format such as IEEE 32-bit floating point, 64 bit floating point, etc. Accordingly, conversions 136a, 136b, translate between the 16-bit floating point format needed by the application and the native floating point supported by the application. In this way, application program 135 may have a more compact data storage format (e.g., 16-bit floating point) while still utilizing the native floating point operations supported by microprocessor 120 by converting between the 16-bit floating point data 137a and the native floating point data 137b. Notably, application program 135, while illustrated here as executing on the same microprocessor 120 wherein the native floating point operations are performed, may execute on a separate microprocessor. Moreover, the data may be stored, transferred, exchanged, etc. before any operations are performed.

FIG. 2B illustrates an embodiment wherein application 135 generates native floating point data 137b. That native floating point data 137b is then converted in accordance with conversions 136a, described more fully below, into 16-bit floating point representations 137a for use or consumption by other applications. That data 137a may subsequently be stored, exchanged, transferred, etc. before consumption. The consuming application may reside locally, on a network, etc.

FIG. 2C is essentially the inverse of the system of FIG. 2B. Here, application 135 generates 16-bit floating point data 137a that is subsequently converted into native floating point data 137b. As with the 16 bit data in FIG. 2B, data 137a may subsequently be stored, exchanged, transferred, etc. before consumption. The consuming application may reside locally, on a network, etc.

A variety of applications programs 135 may make advantageous use of the present invention including: An application (such as an image analysis program) that takes Float16 data as input only would take Float16-valued data (such as images) as input, convert the Float16 values to a native floating point representation, perform computation (such as image analysis, e.g. edge detection) using native floating point, and generate some form of output (perhaps describing where the edges or other features are in the image); An application (such as a 3D rasterizer) that takes Float16 data as input and output would take Float16-valued data (such as textures, displacement maps, etc.) as input, convert the Float16 values to a native floating point representation, perform computation (such as filtering and blending) using native floating point, and convert some or all of the output (such as the color buffer data) to Float16; An application (such as a 3D tessellator) that uses native floating point computation to generate Float16-valued output (such as vertex data, e.g. color data, normal data, or texture coordinate data) would perform native floating point computation (such as conversion of a complex 3D model to simpler hardware-accelerated primitives such as triangles or patches) and convert some or all of the output to Float16 as it is written out. Another example of such an application would be an application that used native floating point computation to generate regular data such as a procedural texture or displacement map that would be written out as Float16.

Floating Point Data Representations

Figure 3A:
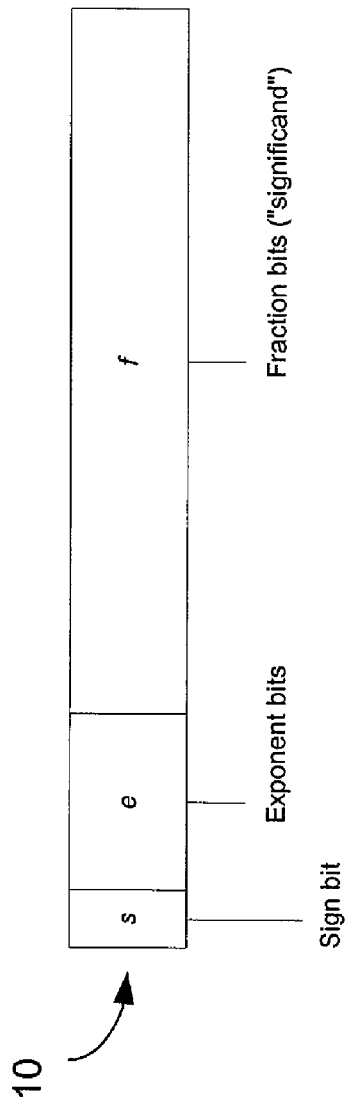
FIG. 3a is a diagram illustrating parts of a floating point number.
Figure 3B:
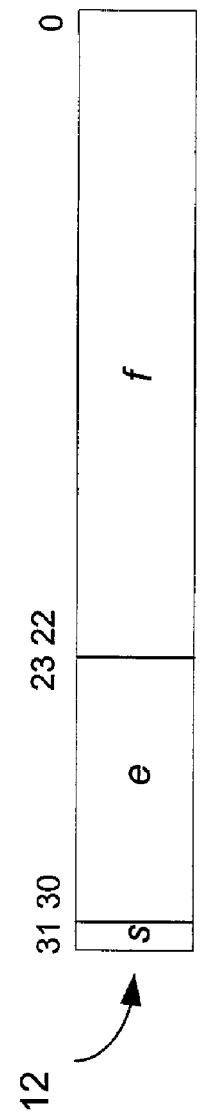
FIG. 3b is a diagram illustrating parts of a 32-bit floating point number.

FIG. 3a provides an illustration of the components of a floating point data representation 10. As illustrated, s, the sign bit, is the most significant bit, e.g., 0 denoting a positive value and 1 denoting a negative value. The portion labeled e represents the number of bits in the exponent, and the portion of labeled f represents the number of bits in the fraction (alternately referred to as the "significand"). FIG. 3b illustrates the bit-wise breakdown in accordance with IEEE 32-bit floating point data representations 12. The least significant twenty-three bits (22-0) represent the significand. The next eight bits (23-30) represent the exponent and the most significant bit (31) represents the sign.

A 16 bit representation in accordance with the invention can be designed based on any number of factors. An important factor may be maintaining as much dynamic range as possible. Assuming that an exponent of 0 to fall in the middle of the range, the unsigned value that ranges from 0 to $2^e-1$ is biased by $2^{e-1}-1$, yielding the following minimum and maximum exponent values:

$$e_{min}=2-2^{e-1}$$

$$e_{max}=2^{e-1}-1$$

f gives the number of bits in the fraction or significand. The significand is combined with the exponent differently depending on the value of the exponent. Table 2-1 enumerates the different possibilities.

TABLE 2-1

Mapping Exponent to Representation

| Exponent | Fraction | Represents |
| --- | --- | --- |
| $e = e_{min} - 1$ | $f = 0$ | $\pm 0$ |
| $e = e_{min} - 1$ | $f \neq 0$ | $0.f \times 2^{e_{min}}$ |
| $e_{min} \leq e \leq e_{max}$ | (any) | $1.f \times 2^e$ |
| * $e = e_{max} + 1$ | $f = 0$ | $\pm \infty$ |
| * $e = e_{max} + 1$ | $f \neq 0$ | NaN |

*The dynamic range may be further increased by incrementing $e_{max}$ by one, though this would make it impossible to represent infinity and NaN (not a number) values.

Denormalized values, described by the second row of Table 2-1, are of particular importance for the low precision floats described here because they are needed to accurately represent small values. If 3 bits of exponent and 12 bits of significand are allowed, the smallest representable normalized value is $2^{-2}=0.25$. The smallest representable denormal given the same number of bits is $2^{-12}2^{-2}=6.10\times10^{-5}$.

The various portions of the 16 bit floating point may be defined in various ways to accommodate different application needs. Some interesting variations are provided below.

Straightforward Generalization of IEEE

This version uses all the conventions of IEEE 32 bit floats, but has fewer exponent bits and fraction bits. As with IEEE, the exponent value is biased by $2^{e-1}-1$ so that a mathematical exponent of 0 lies slightly above the middle of the range of possible exponent values.

| Biased Exp value | Unbiased Exp value | Meaning |
| --- | --- | --- |
| $2^{e-1} - 1$ | $2^e - 1$ | Flag | Infinity or NAN |
| binades | $2^e - 2$ | $(2^e - 2) - (2^{e-1} - 1) =$ $2^{e-1} - 1 = e_{max}$ | Largest normal values |
| ... | ... | | |
| $2^{e-1} - 1$ binades | $2^{e-1}$ $2^{e-1} - 1$ | 1 0 | Values from 1 to 2-ε Values from ½ to 1 - ε |
| | ... | ... | |
| | 1 | $1 - (2^{e-1} - 1) =$ $2 - 2^{e-1} = e_{min}$ | Smallest normal values |
| | 0 | $e_{min}$ | Denormal values |

Variant 1—Moving the Bias

Pixel values are typically less than or equal to 1. In this case it is advantageous to modify the bias value. The most extreme form of this would make the largest normal value binade represent the range 1 to 2-ε. This still gives some "headroom" above 1, but puts resolution into the smaller fractional values. For example, here the bias is $2^e-3$

| Biased Exp value | Unbiased Exp value | Meaning |
| --- | --- | --- |
| | $2^e - 1$ | Flag | Infinity or NAN |
| 1 binade | $2^e - 2$ | 1 | Values from 1 to 2-ε |
| $2^e - 3$ binades | $2^e - 3$ | 0 | Values from ½ to 1 - ε |
| | ... | ... | |
| | 1 | $1 - (2^e - 3) =$ $4 - 2^e = e_{min}$ | Smallest normal values |
| | 0 | $e_{min}$ | Denormal values |

Variant 2—No Denormals

The bit patterns that normally represent denormals could be instead interpreted as an extra binade of normal values. The specific bit pattern of all zeroes would still represent zero. This gives a somewhat abrupt jump from the minimum nonzero value to zero, but gives an extra binade (almost) of precision. For the standard bias of $2^{e-1}-1$ the table would be as follows:

| Biased Exp value | Unbiased Exp value | Meaning |
| --- | --- | --- |
| $2^{e-1} - 1$ binades | $2^e - 1$ $2^e - 2$ | Flag $(2^e - 2) - (2^{e-1} - 1) =$ $2^{e-1} - 1 = e_{max}$ | Infinity or NAN Largest normal values |
| | ... | ... | |
| $2^{e-1}$ binades | $2^{e-1}$ $2^{e-1} - 1$ | 1 0 | Values from 1 to 2-eps Values from ½ to 1 - ε |
| | ... | ... | |
| | 0 | $0 - (2^{e-1} - 1) =$ $1 - 2^{e-1} = e_{min}$ | Smallest normal values |
| | 0 | 0 (and all frac bits = 0) | zero |

Variant 3—Single NaN Values

All the bit patterns with exponent=$2^e-1$ and fraction nonzero are typically interpreted as NaN's. This variant picks only one or two of those bit patterns for NaN (quiet and signaling) and frees up the rest of them to represent almost another binade of larger values. For ease of conversion (see below) the representation of infinity would be moved up to the bit pattern just below the NaN pattern, thus:

| Biased Exponent | Fraction | Meaning |
| --- | --- | --- |
| $2^e - 1$ | 111 ... 111 | NaN sig |
| $2^e - 1$ | 111 ... 110 | NaN quiet |
| $2^e - 1$ | 111 ... 101 | Infinity |
| $2^e - 1$ | 111 ... 100 | Largest non-infinite number |

Dynamic Range

Table 2-2 presents a variety of exponent and significand bit counts, the minimum and maximum representable values, the number of decimal places of precision in the significand, and the dynamic range $$\log_{10}\frac{MAX}{MIN}.$$

The dynamic range is an estimate of the number of F-stops that can be covered by an image using that number representation.

TABLE 2-2

Exponent/Significand Precision Tradeoffs

| Exp bits | Significand | Min. number | Max. number | Decimal places | Dynamic Range |
|---|---|---|---|---|---|
| 3 | 12 | 6.10E−05 | 15.99805 | 3.61 | 5.42 |
| 4 | 11 | 7.63E−06 | 255.9375 | 3.31 | 7.53 |
| 5 | 10 | 5.96E−08 | 65504 | 3.01 | 12.04 |
| 6 | 9 | 1.82E−12 | 4.29E+09 | 2.71 | 21.37 |

5 bits of exponent and 10 bits of significand represent a good tradeoff between range and precision. The implicit 1 in the significand gives 11 bits of precision if the floating point value is normalized. A dynamic range of 12 can accurately represent an image with the same dynamic range as a photographic negative, more than sufficient for most imaging applications.

Infinity/NaN Options

As noted in Table 2-1, the dynamic range can be increased by incrementing $e_{max}$ by 1. According to the IEEE standard, all values with the exponent equal to $e_{max}+1$ are $\pm\infty$ if the fraction is zero or NaN (Not a Number) if the fraction is nonzero; hence, all values with $e_{max}+1$ are reserved and do not represent floating point numbers. One possibility for the Float16 representation would be to reserve just two values out of this family of INF/NaN encodings and make $e_{max}+1$ a valid exponent field for all other fraction values. For example, signed infinity values could be represented by exponent $e_{max}+1$ and fraction of ~0 (or −1 in two's complement), and exponent $e_{max}+1$ and fraction of −2 (two's complement) could represent two NaN values. The rest of the fraction values would be valid Float16 values. Note that the just-described convention differs from the IEEE standard, where a fraction of zero denotes infinity. This design cleanly extends the format described in 2.2, slightly increases the dynamic range and makes better use of the limited number of available bits.

Different Exponent Biases

For images, where small values are more important than large ones, the exponent may be biased so that an exponent of 0 is toward the top of the range rather than the middle. For example, if we bias a 5-bit exponent such that the minimum is −22 instead of −14 and the maximum is 7 instead of 15, the resulting minimum and maximum representable numbers become 2.32E-10 and 255.875, respectively. These minimum and maximum values represent a better match to the requirements of imaging applications.

The conversion algorithms described in below accommodate a variety of exponent biases.

Native Floating Point to Float16 Conversion

According to an aspect of the invention native, e.g., 32-bit floating point (IEEE), can be converted to Float16 for any combination of exponent and significand bit counts. The conversion algorithms are amenable to implementation on multimedia architectures such as MMX, and are especially useful on architectures with registers that can contain either packed floating point or packed integer data, such as AMD's 3DNow and Intel's SSE2.

The algorithms described here clamp to 0 on underflow, but do not properly handle overflow. An alternative approach is to clamp the input values to the minimum and maximum values that respectively convert to the Float16 representation of infinity and of zero, as shown in Listing 3-7. The just-described method is readily adaptable to SIMD implementation, especially if there is a SIMD max and min instruction. A variety of policies (set overflow values to INF, maximum Float16, etc.) could be implemented in a straightforward way by comparing the input value to a threshold and setting the output values accordingly if they are above the threshold. These methods are readily adaptable to a variety of infinity and NaN encodings as well as clamping to a maximum value. The integer-only conversion methods, described more fully below, can readily clamp to a signed infinity value (0xffff or 0x7fff) by computing a mask (0 or ~0) based on whether the input value exceeds the threshold, computing the AND of that mask with the value 0x7fff, and OR'ing the result into the output value just before returning. The just-described method is readily adaptable to SIMD implementation as well. The methods presented here are examples, other algorithms may be implemented that perform a similar conversion.

Table 3-1 gives a set of defines that will be used throughout the presentation of these algorithms. All values are derived from cExpBits, the number of exponent bits. For example, the number of bits in the significand is (15-cExpBits) because that is the number of bits left over in a 16-bit word after assigning the exponent bits and sign bit

TABLE 3-1

Defines Used in Code Fragments

| Name | Description | Definition |
|---|---|---|
| CexpBits | Number of bits in the exponent | (5)* |
| CexpMask | Mask for the exponent bits | ((1 << cExpBits) − 1) |
| CexpBias | Bias to apply to the exponent | ((1 << (cExpBits − 1)) − 1) |
| CfractBits | Number of bits in the significand | ((15) − (cExpBits)) |
| CfractMask | Mask for the significand | ((1 << cFractBits) − 1) |
| Emin | Minimum exponent | (2 − (1 << (cExpBits − 1)))** |
| Emax | Maximum exponent | ((1 << (cExpBits − 1)) − 1)** |

*The algorithms can be applied to representations with exponent bit counts other than 5.
**The minimum and maximum exponents given here put 1.0 (exponent of 0) in the middle of the range; for imaging applications, it probably makes more sense to bias the exponent such that it falls in the higher end of the range.

Rounding

When converting from Float32 or other higher precision floating point representations to Float16, output values that are not exactly representable in the output format must be rounded. Different rounding policies include truncation, round-to-nearest (RTN), and round-to-even (RTE). Truncation discards the precision bits that cannot be represented in the more compact format. RTN and RTE round to the nearest value in the output format, which is straightforward except in the case where the input value falls exactly between the two possible output values. RTN rounds these half cases away from 0, i.e. (ignoring signs) 0.5 is rounded to 1.0 and 1.5 is rounded to 2.0. RTE rounds these halfway cases to the nearest even value: 0.5 is rounded to 0.0 and 1.5 is rounded to 2.0. RTE is the recommended rounding mode per the IEEE floating point standard.

Float-Based Preprocessing

According to an aspect of the invention, an example method for performing floating point operations on the input values to ensure that they are rounded to the correct Float16 representation is described below. The floating point values used to make these adjustments are constructed with logical operations, then added to and subtracted from the input floating point value to ensure that the truncated Float16 value is correctly rounded.

Although the x87 instruction set is not well suited to performing logical operations on floating point values, the SIMD floating point instruction sets from both Intel and AMD (SSE1 and 3DNow, respectively) do include logical operations on packed floating point values that make these adjustment values easy to compute.

For denormals, adjusting the floats as described here will not result in properly rounded results. However, the methods described below in the sections entitled "Leverage Denormal Hardware" and "Compute Denormal Fraction Conditionally" will result in correct rounding, since the code paths for denormals perform rounding based on the current rounding mode of the processor. Provided the applicable rounding mode is set in the CPU's state, denormals will be rounded properly when using these techniques.

Round To Nearest

Figure 4:
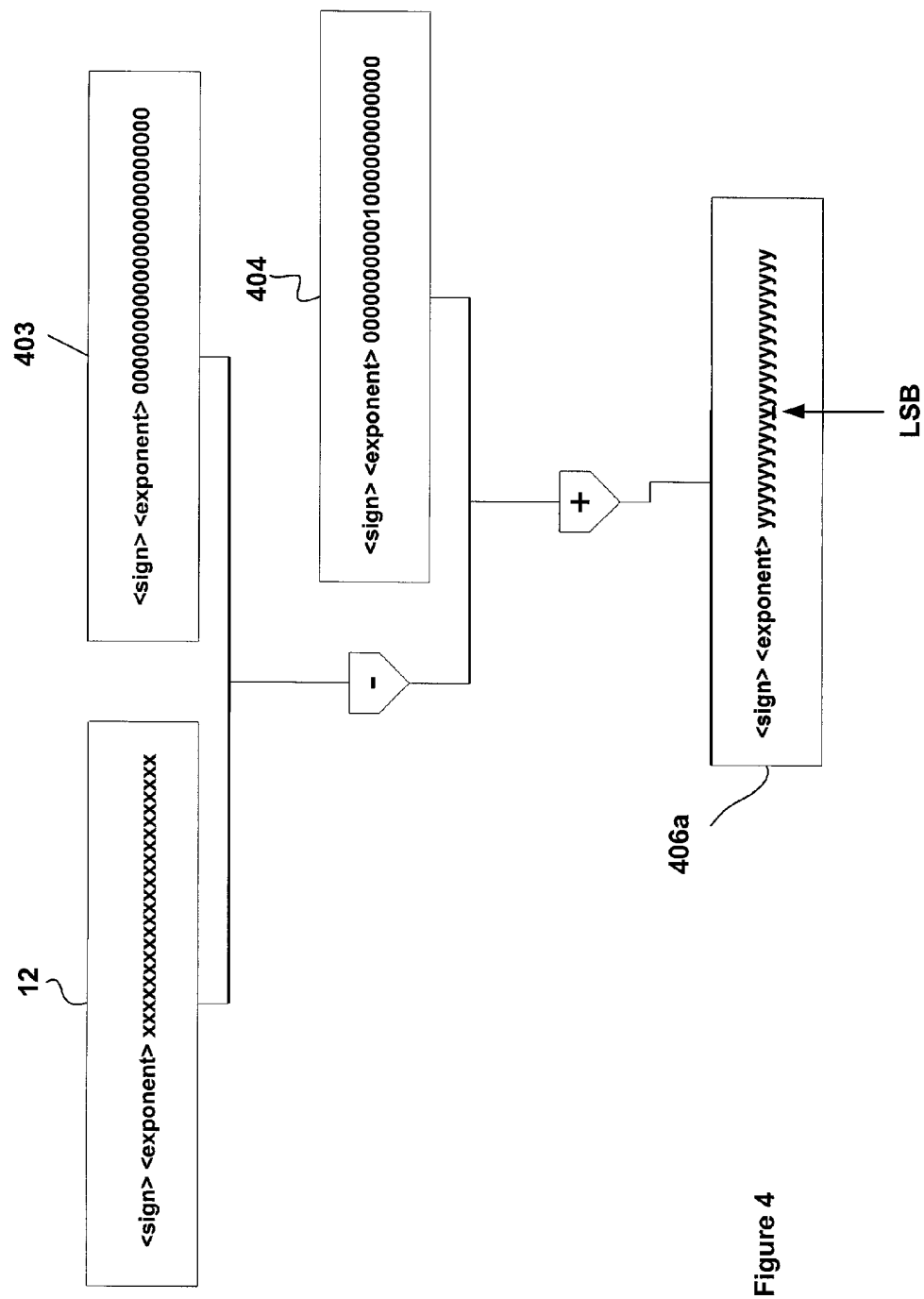
FIG. 4 illustrates a conversion from 32-bit floating to 16-bit floating point in accordance with the invention.

FIG. 4 illustrates the round to nearest algorithm to convert a 32-bit floating point value 12 to a 16-bit floating point value least significant bit (LSB) with 5 bits of exponent and 10 bits of significand. First, a value 403 having sign and exponent that are the same as the input, but whose significand is zero are subtracted from the 32-bit float to be converted 12. Then, a value 404 having an input sign and exponent whose significand is zero except for a 1 bit just below the 16-bit LSB is added to the output from the subtraction step. To produce output 406a.

C code to adjust a float using this algorithm for Float16's with cExpBits bits of exponent is as follows.

```
inline UINT AsInteger(float f) {return *(int *)&f;}
// pre-munge float for rounding
float RTN16(float f)
{
    UINT uSubRound = AsInteger(f);
    uSubRound &= ~((1<<23)-1);
    UINT uAddRound = uSubRound | (1<<(22-cFractBits));
    f -= *(float *) (&uSubRound);
    f += *(float *) (&uAddRound);
        return f;
}
```

Note that this adjustment works only for Float16 normal outputs. For denormal output values, a conversion method that uses the processor rounding mode for denormals (such as the methods of described below) will generate correctly rounded outputs for both normals and denormals. On some hardware architectures, such as the Intel x86, there is no native round-to-nearest rounding mode. A naïve implementation of this algorithm would then result in RTN for Float16 normals and RTE for Float16 denormals. To force RTE to behave like RTN, the LSB of the input floating point values may be set by OR'ing the floats with the value 1. This causes the native RTE rounding mode of the processor to behave exactly like RTN. Since the input floating point value is much higher precision than the output Float16 value, this modification will not affect the conversion in any way except to ensure a consistent rounding mode for both normal and denormal outputs.

Round To Nearest Even

Figure 5:
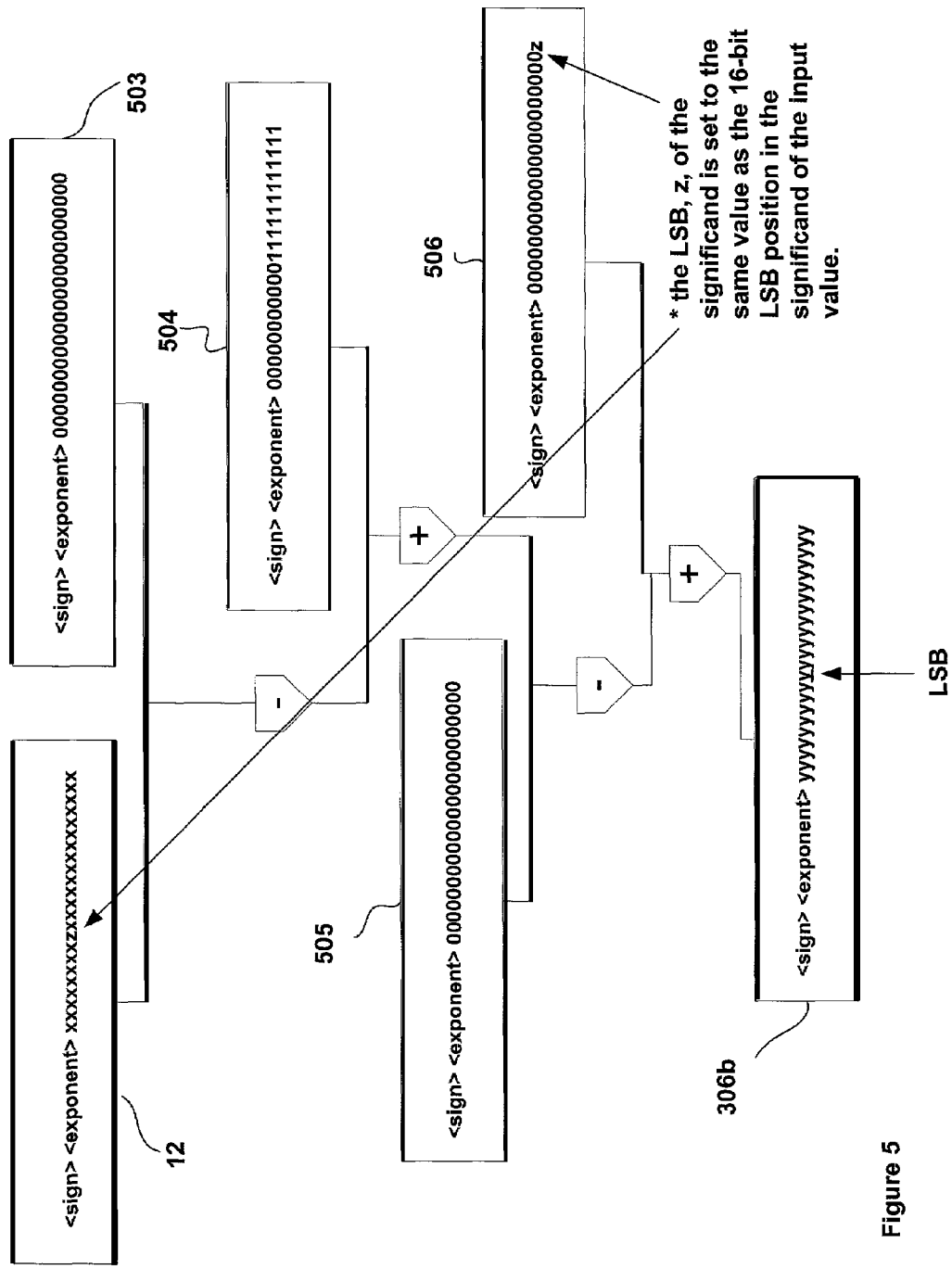
FIG. 5 illustrates a conversion from 32-bit floating to 16-bit floating point in accordance with the invention.

For RTE, two subtractions and two additions are performed. FIG. 5 illustrates the process. Again, all adjustment values have the same sign and exponent and 10 bits of significand are used in the 16-bit float value. First, a value 503 having sign and exponent that are the same as the input 12, but whose significand is zero, are subtracted from the 32-bit float to be converted 12. Then, a value 504 having an input sign and exponent whose significand is zero except for the 12 least significant bits, which are set to 1 are added to the output from the subtraction step. Again, a value 505 having sign and exponent that are the same as the input, but whose significand is zero, are subtracted from the 32-bit float output from the previous addition. Lastly, a value 506 having sign and exponent that are the same as the input, but whose significand is zero except for the least significant bit, which is set to the same value as the 16-bit LSB position in the significand of the input value 12, is added to the output from the previous step. The adjusted output value is 306b.

For instruction sets that do not share integer and floating point state, such as the SSE1 (Pentium 3) instruction set, some creativity is needed to compute the second value, which shifts a bit from the input operand to the LSB. In the case of SSE1, the ANDPS instruction can be used to isolate the bit; then the CMPEQPS instruction can be used to generate a mask of all 1's if the value is nonzero; and another ANDPS instruction can then isolate the bit in the least significant position. The resulting value can then be OR'd into a masked version of the input operand using the ORPS instruction. Variants of this method may apply to other architectures, depending on the instructions available.

Integer Processing

Alternatively, the floating point values can be adjusted using integer processing before conversion such that they are rounded to the correct 16-bit float value. These methods are similar to the floating point methods just described, but treat the input values as integers. Hence, they are more amenable to implementation on architectures whose registers can be treated as floating point or integer (3DNow or Pentium4).

Round To Nearest

This method involves treating the float as a 32-bit integer and adding the integer that is all 0 except for a 1 just below the LSB of the 16-bit floating point significand. This value happens to be the same as the float value discussed in in the section above except that the sign and exponent fields are 0. Overflow of the significand causes the exponent to be incremented, which is the desired outcome. If the exponent field is maximum, it will overflow into the sign bit and generate invalid results; but such values fall in the overflow range, so must be dealt with separately similar to the methods described in the opening paragraph of the section entitled "Native Floating Point To Float16 Conversion."

C code that implements this method is as follows.

```
inline UINT AsInteger(float f) {return *(int *)&f;}
inline float AsFloat (UINT i) {return *(float*)&i;}
float RTN16int(float f)
{
    return AsFloat( AsInteger(f) + (1<<(22-cFractBits)) );
}
```

For Float16 denormals, the fraction is shifted so that the least significant bit lines up with the least significant bit of the normal fraction; the same adjustment can then be applied regardless of whether the output is a Float16 normal or denormal.

Round To Even

The integer-based method can be modified to round-to-even using a strategy similar to the float-based round-to-even method described above. FIG. 6 illustrates the process. Starting with the 32-bit floating point data 12 treated as an integer, a mask of twelve 1 bits 603 is added to the starting value 12. Thereafter, a value 604 that is set to zero except for the least significant bit, which is set to the same value as the 16-bit LSB position in the significand of the input value 12, is added to the output from the previous step. The adjusted output value is 306b.

Naïve Algorithm

It is straightforward to construct values representable by 16-bit normals using the sign bit, the exponent (adjusted as needed), and the most significant bits of the fraction. If the number is too small to be represented using a 16-bit normal, a denormal must be computed. The implicit 1 in the fraction of a normal is explicitly OR'd in, and the value is shifted right and the exponent is incremented until it is equal to the minimum exponent. If the value is too small, the output is naturally clamped to zero as the bits are shifted completely out of the significand and the exponent is set to $e_{min}-1$.

Listing 3-1 shows a function written in C to perform this conversion, assuming a 5 bit exponent and minimum exponent of −14. This function truncates the output; the floating point values must be massaged as described in above if rounding is desired.

Listing 3-1. C Implementation

```
WORD
ConvertToFloat16( float f)
{
    WORD w;
    UINT u = *(UINT *) (&f);
    UINT Sign = u>>31;
    UINT BiasedExp = (u>>23)&0xff;
    int Exp = (int) BiasedExp-127;
    UINT Fract = u&((1<<23)-1);
    WORD wFract = (WORD) (Fract>>(23-cFractBits))|(1<<cFractBits);
    int ExpPrime = Exp;
    while ( ExpPrime < eMin )
    {
        ExpPrime += 1;
        wFract >>= 1;
    }
    if( Exp < eMin-1 )
        Exp = eMin-1;
    w = (WORD) ((Exp+cExpBias)&cExpMask)<<cFractBits;
    w |= (Sign<<15) | wFract;
    return w;
}
```

Listing 3-1a shows an optimized C version that replaces the loop with a computed shift. This optimization does not translate to certain SIMD architectures that require the shift amount applied to the packed integers to be the same (MMX is one such SIMD architecture). This optimization does apply to SIMD architectures that allowed packed integers to each be shifted by the amount specified by corresponding packed integers.

Listing 3-1a. C Implementation (computed shift)

```
WORD
ConvertToFloat16 ( float f )
{
    UINT u = *(UINT *) (&f);
    UINT Sign = u >>31;
    UINT BiasedExp = (u>>23)&0xff;
    int Exp = (int) BiasedExp-127;
    UINT Fract = u&((1<<23)-1);
    WORD w = Sign<<15;
    if ( Exp > eMax )
    {
        w |= 0x7fff;      // not representable by 16 bit float
    }
    else if ( Exp >= eMin ) // normal
    {
        w |= (WORD) (Exp+cExpBias)<<cFractBits;
        w |= (Fract>>(23-cFractBits));
    }
    else if ( Exp >= eMin-cFractBits ) // denormal
    {
        Fract |= (1<<23); // implicit 1 now explicit
        w |= (Fract>>((eMin-Exp)+23-cFractBits));// -14 - Exp + 23 - 10
    }
    //else (+-) zero
    return w;
}
```

SIMD Implementation

The naïve algorithm can be implemented using SIMD code to perform more than one conversion simultaneously. Listing 3-2 gives an MMX implementation of the algorithm given in Listing 3-1. Listing 3-2 uses the MMX data type _m64 and intrinsics of the Visual C++ Processor Pack for readability and to offload the tasks of register allocation and scheduling onto the compiler.

In the case of MMX, care must be taken because the register state is aliased on the floating point register state; after performing MMX instructions, an EMMS instruction must be executed before the processor can do floating point processing again. Since EMMS can be expensive, it is important to make sure to do enough MMX processing that the performance benefits are not overwhelmed by the cost of transitioning between MMX and non-MMX processing modes.

Listing 3-2. MMX Implementation

```
void
FourTo16( WORD *pOut, float *pIn )
{
    static __m64 f[2];
    f[0] = ((__m64 *) pIn)[0];
    f[1] = ((__m64 *) pIn)[1];
```

-continued

Listing 3-2. MMX Implementation

```
   __m64 Sign64 = __mm_packs_pi32( __mm_srai_pi32( f[0], 16 ),
                                   __mm_srai_pi32( f[1], 16 ) );
//static const __m64 Sign64Mask = __mm_set1_pi16( (short) 0x8000 );
   Sign64 = __mm_and_si64( Sign64, Sign64Mask );
   __m64 BiasedExp64 = __mm_packs_pi32(  __mm_srli_pi32( f[0], 23 ),
                                         __mm_srli_pi32( f[1], 23 ) );
//static const __m64 BiasedExp64Mask = __mm_set1_pi16( 0xff );
   BiasedExp64 = __mm_and_si64( BiasedExp64, BiasedExp64Mask );
//static const__m64 Exp64Bias = __mm_set1_pi16( -127 );
   __m64 Exp64 = __mm_add_pi16( BiasedExp64, Exp64Bias );
   const __m64 MaskFract = __mm_set1_pi32( ((1<<(23-cFractBits))-1)<<cFractBits );
   __m64 Fract64 = __mm_packs_pi32( __mm_srli_pi32( __mm_and_si64( f[0], MaskFract ),
23-cFractBits ),
                    __mm_srli_pi32( __mm_and_si64( f[1], MaskFract ), 23-cFractBits ) );
   // implicit 1 in significand now explicit
//static const __m64 Explicit1 = __mm_set1_pi16( 1<<cFractBits );
   Fract64 = __mm_or_si64( Fract64, Explicit1 );
   // Clear exp if value is zero (Exp==-127 and fract == 0)
   // We will also OR into this mask for denormals
   __m64 EqualZeroMask = __mm_and_si64( __mm_cmpeq_pi16( Fract64, Explicit1 ),
              __mm_cmpeq_pi16( Exp64, Exp64Bias ) );
   __m64 ExpPrime = __mm_andnot_si64( EqualZeroMask, Exp64 );
   ExpPrime = __mm_packs_pi16( ExpPrime, ExpPrime );
   __m64 ShiftBy = __mm_setzero_si64( );
   __m64 KeepLooping;
   do
   {
      KeepLooping = __mm_cmpgt_pi8( __mm_set1_pi8( eMin ), ExpPrime );
      ExpPrime = __mm_sub_pi8( ExpPrime, KeepLooping );
      ShiftBy = __mm_sub_pi8( ShiftBy, KeepLooping );
   } while ( __mm_cvtsi64_si32( KeepLooping ) );
   UINT Shifts = __mm_cvtsi64_si32( ShiftBy );
   if ( Shifts )
   {
      // legacy MMX formulation - if insrw/extrw available,
      // they can be used to good advantage here
      __m64 Mask = __mm_cvtsi32_si64( 0xffff );
      for ( int i = 0; i < 4; i++ )
      {
         __m64 Shift = __mm_cvtsi32_si64( Shifts & 0xff );
         if ( Shifts & 0xff )
         {
            Fract64 = __mm_or_si64( __mm_and_si64( Mask, __mm_srl_pi16(Fract64, Shift)),
                  __mm_andnot_si64( Mask, Fract64 ) );
            EqualZeroMask = __mm_or_si64( EqualZeroMask, Mask );
         }
         Shifts >>= 8;
         // mark for zero exponent
         Mask = __mm_slli_si64( Mask, 16);
      }
   }
//static const __m64 cExpBias64 = __mm_set1_pi16( cExpBias );
   __m64 Output = __mm_add_pi16( Exp64, cExpBias64 );
   Output = __mm_andnot_si64( EqualZeroMask, Output );
   Output = __mm_and_si64( Output, __mm_set1_pi16( cExpMask ) );
   Output = __mm_slli_pi16( Output, cFractBits );
//static const __m64 Fract64Mask = __mm_set1_pi16( (1<<cFractBits)-1 );
   Output = __mm_or_si64( Output, __mm_and_si64( Fract64, Fract64Mask ) );
   Output = __mm_or_si64( Output, Sign64 );
   *((__m64 *) pOut) = Output;
   __mm_empty( );
}
```

Unroll Denormal Loop

The SIMD formulation has the disadvantage that normal 16-bit floating point values are much faster to convert than denormals, due to the shifting and incrementing of the exponent that must occur for denormals. If denormals are an exceedingly uncommon case, these execution characteristics are acceptable; but if denormals can reasonably be expected, a more level conversion algorithm (with similar performance for normals and denormals) would be preferable. One way to implement a more level conversion algorithm is to formulate the loop that adjusts the significand and exponent for denormals such that it does nothing for normals while making adjustments for denormals. The loop can then be unrolled to avoid conditional code, making denormals faster while making normals somewhat slower. The number of loop iterations to unroll is equal to the number of fraction bits, plus one for the hidden bit.

Insert/Extract Word Instructions

SSE1 added new instructions to insert and extract 16-bit words in specific locations within the 64-bit MMX registers (these instructions are also available on the Athlon and subsequent processors from AMD). These instructions can be used to good effect when making the shift adjustments for denormals. The code sequence

```
_m64 Mask = _mm_cvtsi32_si64( 0xffff );
for ( int i = 0; i < 4; i++ )
{
    _m64 Shift = _mm_cvtsi32_si64( Shifts & 0xff );
    if ( Shifts & 0xff )
    {
        Fract64 = _mm_or_si64( _mm_and_si64( Mask, _mm_srl_pi16(Fract64, Shift)),
                _mm_andnot_si64( Mask, Fract64 ) );
        EqualZeroMask = _mm_or_si64( EqualZeroMask, Mask );
    }
    Shifts >>= 8;
    // mark for zero exponent
    Mask = _mm_slli_si64( Mask, 16 );
}
``` can be rewritten as

```
UINT Shift = Shifts & 0xff;
if ( Shift )
{
    Fract64 = _mm_insert_pi16( Fract64, _mm_extract_pi16(Fract64, 0)>>Shift, 0 );
    // mark for zero exponent
    EqualZeroMask = _mm_insert_pi16( EqualZeroMask, 0xffff, 0 );
}
Shifts >>= 8;
Shift = Shifts & 0xff;
if ( Shift )
{
    Fract64 = _mm_insert_pi16( Fract64, _mm_extract_pi16(Fract64, 1)>>Shift, 1 );
    // mark for zero exponent
    EqualZeroMask = _mm_insert_pi16( EqualZeroMask, 0xffff, 1 );
}
Shifts >>= 8;
Shift = Shifts & 0xff;
if ( Shift )
{
    Fract64 = _mm_insert_pi16( Fract64, _mm_extract_pi16(Fract64, 2)>>Shift, 2 );
    // mark for zero exponent
    EqualZeroMask = _mm_insert_pi16( EqualZeroMask, 0xffff, 2 );
}
Shifts >>= 8;
Shift = Shifts & 0xff;
if ( Shift )
{
    Fract64 = _mm_insert_pi16( Fract64, _mm_extract_pi16(Fract64, 3)>>Shift, 3 );
    // mark for zero exponent
    EqualZeroMask = _mm_insert_pi16( EqualZeroMask, 0xffff, 3 );
}
```

The code must be unrolled because the parameters that specify the word positions 0-3 to _mm_insert_pi16 and _mm_extract_pi16 must be constants.

Leverage Denormal Hardware

The formulations described so far all explicitly shift the significand while adjusting the exponent for denormal values. This section describes a way to leverage denormal hardware to make these adjustments before performing the conversion. This algorithm has good performance on architectures that can efficiently operate on denormals using its native floating point hardware.

To convert Float32 to Float16, multiply the input float by $2^{-127-e_{mm}}$ to force the float into denormal range if it is in denormal range for the 16-bit output float. If this happens, the exponent of the float will be set to −127 or $e_{min}-1$ for single-precision floats, and the most significant bits in the significand will be set to whatever the significand in the output denormal should receive. For floats that are not in denormal range for the output 16-bit float, the exponent will simply be decreased and the significand will be unaffected.

Listing 3-3 gives a C program that implements this algorithm for 16-bit floats with a 5-bit exponent with a bias of 15 (minimum exponent is −14).

Listing 3-3. C Implementation Using Denormals

```
WORD
ConvertToFloat16( float f )
{
    UINT uPow2t112 = (-112+127)<<23;
    float f = _f * *((float *) (&uPow2t112));
    UINT u = *(UINT *) (&f);
    UINT Sign = (u>>16)&0x8000;
    UINT BiasedExp = (u>>23)&0xff;
    int Exp = (int) BiasedExp-(127-112);
    UINT Fract = u&((1<<23)-1);
    WORD wFract = (WORD) (Fract>>(23-cFractBits));
    if ( Exp > eMax )
    {
        // not representable by 16 bit float
        w = Sign|0x7fff;
        return;
    }
    if( Exp < eMin-1 )
        Exp = eMin-1;
```

-continued

Listing 3-3. C Implementation Using Denormals

```
WORD Output = (WORD) ((Exp+cExpBias)&cExpMask)<<cFractBits;
Output |= wFract;
Output |= Sign;
return Output;
}
```

This algorithm may be implemented efficiently using a SIMD instruction set. Listing 3-4 gives an implementation that leverages the denormal hardware built into the Pentium3 instruction set. Since the denormal hardware adjusts the exponent and significand of the input floating point value to reflect 16-bit denormals, the integer portion of this algorithm is much simpler.

```
DenormalFraction = FloatToInt(f*1/MinDenormal);
PropSign = DenormalFraction>>31;
DenormalFraction ^= (PropSign>>1);      // sign-magnitude form
DenormalFraction -= PropSign;
if ( abs(f) < DenormalBoundary )
        Fraction = DenormalFraction;
else
        Fraction = (Float32&FractionMask)>>(23-cFractBits)
```

Note that 1/MinDenormal is a fairly large number, since denormals are small. For a 16-bit float with 5-bit exponent and a bias of 15, 1/MinDenormal is $2^{24}$ = 16777216. Also note that converting to sign-magnitude form is not necessary if the absolute value of the input is available:

```
fMag = abs(f)
DenormalFraction = FloatToInt(fMag*1/MinDenormal);
if( fMag < DenormalBoundary )
```

Listing 3-4. SIMD Implementation Using Denormals

```
__declspec(align(16)) static __m64 f[2];
__declspec(align(16)) static UINT uPow2t112[4] = { (-112+127)<<23, (-112+127)<<23,
            (-112+127)<<23, (-112+127)<<23 };
void
FourTo16( WORD *pOut, float *pIn )
{
    *((__m128 *) (&f)) = _mm_mul_ps( _mm_load_ps( (float *) (&uPow2t112)),
_mm_load_ps( pIn ) );
    __m64 Sign64 = _mm_packs_pi32( _mm_srai_pi32( f[0], 16 ),
    _mm_srai_pi32( f[1], 16 ));
    Sign64 = _mm_and_si64( Sign64, Sign64Mask );
    __m64 BiasedExp64 = _mm_packs_pi32(  _mm_srli_pi32( f[0], 23 ),
                                    _mm_srli_pi32( f[1], 23 ) );
    BiasedExp64 = _mm_and_si64( BiasedExp64, BiasedExp64Mask );
    __m64 Fract64 = _mm_packs_pi32( _mm_srli_pi32( _mm_and_si64( f[0], MaskFract ), 23-
cFractBits ),
                        _mm_srli_pi32( _mm_and_si64( f[1], MaskFract ), 23-cFractBits ) );
    __m64 Output = _mm_slli_pi16( BiasedExp64, cFractBits );
//static const __m64 Fract64Mask = _mm_set1_pi16( (1<<cFractBits)-1 );
    Output = _mm_or_si64( Output, _mm_and_si64( Fract64, Fract64Mask ) );
    Output = _mm_or_si64( Output, Sign64 );
    *((__m64 *) pOut) = Output;
}
```

Compute Denormal Fraction Conditionally

AMD's 3DNow instruction set for SIMD floating point cannot be used to implement the algorithm given immediately above because 3DNow implementations clamp denormal values to 0.

An alternative algorithm is to compute the fraction of a 16-bit denormal by other means and evaluate a condition to decide whether to use it. The denormal fraction may be computed by multiplying by the reciprocal of the minimum 16-bit denormal, converting to int and then converting the two's complement output to sign-magnitude form:

-continued

```
        Fraction = DenormalFraction;
else
        Fraction = (f&FractionMask)>>(23-cFractBits)
```

If the input value is equal to the minimum representable denormal, DenormalFraction is set to 1, and so on.

Listing 3-5 gives a C implementation of this algorithm.

Listing 3-5. C Implementation: Compute Denormal Fraction Conditionally

```
WORD
ConvertToFloat16( float f )
{
    UINT u = *(UINT *) (&f);
    UINT Sign = (u >>16)&0x8000;
    UINT BiasedExp = (u>>23)&0xff;
    int Exp = (int) BiasedExp-127;
    UINT Fract = u&((1<<23)-1);
    WORD wFract = (WORD) (Fract>>(23-cFractBits));
```

-continued

Listing 3-5. C Implementation: Compute Denormal Fraction Conditionally

```
    if ( fabsf(f) < powf( 2.0f, (float) eMin ) )
    {
        float fDenormalResult = powf(2.0f, (float) -(eMin-cFractBits))*f;
        int i = (int) fDenormalResult;
        int propsign = i>>31;
        i ^= propsign >> 1;
        i -= propsign;
        wFract = (WORD) i;
    }
    if ( Exp < eMin-1 )
        Exp = eMin-1;
    w = (WORD) ((Exp+cExpBias)&cExpMask)<<cFractBits;
    w |= wFract;
    w |= Sign;
}
```

The algorithm given in Listing 3-5 is readily implementable in terms of SIMD programming constructs. A denormal mask is computed based on whether the input floats are less than the denormal boundary for the output format; the fraction is computed for both the normal and denormal cases, and then logical operations are used to construct the output fraction. The sign and exponent are straightforward to compute with shifts, masks and arithmetic operations to deal with the exponent biases.

Listing 3-6. SIMD Implementation: Compute Denormal Fraction Conditionally

```
__declspec(align(16)) static __int64 AbsMask[2] = { 0x7fffffff7fffffff,
    0x7fffffff7fffffff };
__declspec(align(16)) static __m128 Denormal16Limit =
    { 1.0f/16384.0f, 1.0f/16384.0f, 1.0f/16384.0f, 1.0f/16384.0f };
__declspec(align(16)) static __int64 LessThanDenormalMasks[ ] =
    { 0x0000000000000000, 0x000000000000ffff, 0x00000000ffff0000, 0x00000000ffffffff,
      0x0000ffff00000000, 0x0000ffff0000ffff, 0x0000ffffffff0000, 0x0000ffffffffffff,
      0xffff000000000000, 0xffff00000000ffff, 0xffff0000ffff0000, 0xffff0000ffffffff,
      0xffffffff00000000, 0xffffffff0000ffff, 0xffffffffffff0000, 0xffffffffffffffff };
__declspec(align(16)) static __m128 DenormalMul = { 16777916.0f, 16777916.0f,
    16777916.0f, 16777916.0f };
void
FourTo16( WORD *pOut, float *pIn )
{
    __m128 m128In = _mm_load_ps( pIn );
    *((__m128 *) (&f)) = m128In;
    __m64 Fract64;
    {
        __m64 DenormalMask;
        {
            __m128 LessThanDenormal = _mm_and_ps( m128In, *((__m128 *) (&AbsMask)) );
            LessThanDenormal = _mm_sub_ps( LessThanDenormal, Denormal16Limit );
            int SignBits = _mm_movemask_ps( LessThanDenormal );
            DenormalMask = ((__m64 *) (&LessThanDenormalMasks))[SignBits];
        }
        __m64 Fract64Denormal;
        {
            m128In = _mm_mul_ps( m128In, DenormalMul );
            __m64 Fract64Lo = _mm_cvttps_pi32( m128In );
            __m64 Fract64Hi = _mm_cvttps_pi32( _mm_shuffle_ps( m128In, m128In,
_MM_SHUFFLE(3,2,3,2) ) );
            Fract64Denormal = _mm_packs_pi32( Fract64Lo, Fract64Hi );
            __m64 Fract64DenormalSign = _mm_srai_pi16( Fract64Denormal, 15 );
            Fract64Denormal = _mm_xor_si64( Fract64Denormal, _mm_srli_pi16(
Fract64DenormalSign, 1 ) );
            Fract64Denormal = _mm_sub_pi16( Fract64Denormal, Fract64DenormalSign );
        }
        __m64 Fract64Normal = _mm_packs_pi32( _mm_srli_pi32( _mm_and_si64( f[0],
MaskFract ), 23-cFractBits ),
                _mm_srli_pi32( _mm_and_si64( f[1], MaskFract ), 23-cFractBits ) );
        Fract64 = _mm_or_si64( _mm_and_si64( DenormalMask, Fract64Denormal ),
                _mm_andnot_si64( DenormalMask, Fract64Normal ) );
    }
    __m64 Sign64 = _mm_packs_pi32( _mm_srai_pi32( f[0], 16 ), _mm_srai_pi32( f[1], 16 ) );
    Sign64 = _mm_and_si64( Sign64, Sign64Mask );
    __m64 BiasedExp64 = _mm_packs_pi32( _mm_srli_pi32( f[0], 23 ), _mm_srli_pi32( f[1], 23 )
```

-continued

Listing 3-6. SIMD Implementation: Compute Denormal Fraction Conditionally

```
);
    BiasedExp64 = _mm_and_si64( BiasedExp64, BiasedExp64Mask );
    BiasedExp64 = _mm_add_pi16( BiasedExp64, Exp64Bias );
    BiasedExp64 = _mm_add_pi16( BiasedExp64, cExpBias64 );
    BiasedExp64 = _mm_andnot_si64( _mm_cmpgt_pi16( _mm_setzero_si64( ), BiasedExp64 ),
BiasedExp64 );
    _m64 Output = _mm_slli_pi16( BiasedExp64, cFractBits );
    Output = _mm_or_si64( Output, Fract64 );
    Output = _mm_or_si64( Output, Sign64 );
    *((_m64 *) pOut) = Output;
}
```

Integer Only Method With Round-To-Nearest

This method uses integer operations only on the input floating point value. The sign bit is masked off in order to check the magnitude of the float for overflow and denormal status. If a denormal is detected, the fraction is shifted into the appropriate location (aligned with the normal fraction), the adjustment described in above in the Integer Processing Round To Nearest section is applied, and the value is shifted right to yield a 16-bit word. C code to implement this algorithm is given in Listing 3-7.

MagU=(Fract>>nshift)−BiasDiff0;//Compensate for BiasDiff0 addition below as a right shift, followed by a series of conditional left shifts implemented using the identity:

$$x<<1 = x+x;$$

Hence, the following:

if (condition) $x<<=1$;

Listing 3-7. Integer Conversion (Round To Nearest)

```
typedef unsigned short   WORD;
typedef unsigned int     UINT;
inline UINT AsInteger(float f) {return *(int *)&f;}
int
Round00( float f )
{
const UINT BiasDiff0 = (cExpBias−127)<<23; // rebias constant in Float32 exp position
const UINT wMinRInfin = ((eMax+127)<<23)|0x7FF000; // min float32 that rounds to infinity
477FF000
const UINT wMinNormal1= ((eMin +127)<<23)|0x7FFFFF;
const UINT wMaxToZero = ((eMin−12+127)<<23)|0x7FFFFF;
    UINT u = AsInteger(f);
    WORD w = (u >> 16)& 0x8000; // sign
    UINT MagU = u & 0x7FFFFFFF; // clear sign bit
    if (MagU > wMinRInfin)      // not representable by 16 bit float
        MagU = wMinRInfin;      // bit pattern that converts to infinity
    if (MagU < wMaxToZero)
        MagU = wMaxToZero;      // bit pattern that converts to zero
    if ( MagU >= wMinNormal1 )  // normal
        {
        w |= ((MagU + BiasDiff0+0x1000)>>(23−cFractBits));
        }
    else            // denormal
    {
        UINT Fract = (MagU&((1<<23)−1)) | (1<<23); // implicit 1 now explicit
        int nshift = (eMin+127−(MagU>>23));
        MagU = (Fract>>nshift); // denormalize
        w |= ((MagU +0x1000)>>(23−cFractBits));
    }
    return w;
}
```

A SIMD implementation of this algorithm is straightforward if a computed shift is available, as required to adjust the denormal fraction. If the same shift amount must be applied to all of the packed integers participating in the SIMD computation, the computed shift can be reformulated as a series of conditional shifts, causing each element in the SIMD register to stop shifting at the appropriate time. One implementation recasts the right shift of MagU where: may be conveniently implemented using SIMD as follows:

$$x+=(\text{condition ?~0:0}) \& x;$$

Another strategy is to perform the initial processing and synthesize the output using SIMD operations, but use a conditional branch to check whether any of the operands are Float16 denormals. Values that are Float16 denormals can be manually extracted, adjusted using a computed shift, and inserted into the appropriate portions of the SIMD register containing the fractions. The resulting implementation is much faster than the non-SIMD implementation for denormals and performance competitive with the non-SIMD implementation for denormals.

Integer Only Method With Round-To-Even

This method is identical to the one described immediately above except that it uses the rounding technique described in Integer Processing—Round To Even section above The 3DNow architecture from AMD gains the same benefits because it also aliases packed integer and packed floating point state onto the same registers.

Float16 To Float32 Conversion

At first glance, the task of converting from Float16 to IEEE single precision floating point values is simpler than the other way around because there are fewer Float16 values to consider. The problem lends itself to lookup based solu-

| Listing 3-8. Integer Conversion (Round To Even) |
|---|

```
typedef unsigned short WORD;
typedef unsigned int UINT;
inline UINT AsInteger(float f) {return *(int *)&f;}
WORD
RTE02( float f )    // correct
{
const UINT BiasDiffo = (cExpBias–127)<<23; // rebias constant in Float32 exp position
const UINT wMinRInfin = ((eMax+127)<<23)|0x7FF000; // min float32 that rounds to infinity
477FF000
const UINT wMinNormal1 = ((eMin+127)<<23)|0x7FFFFF;
const UINT wMaxToZero = ((eMin–12+127)<<23)|0x7FFFFF;
    UINT u = AsInteger(f);
    WORD w = (u >> 16)& 0x8000;// sign
    UINT MagU = u & 0x7FFFFFFF;// clear sign bit
    if (MagU > wMinRInfin)      // not representable by 16 bit float
        MagU = wMinRInfin;   // bit pattern that converts to infinity
    if (MagU < wMaxToZero)
            MagU = wMaxToZero;     // bit pattern that converts to zero
    if ( MagU >= wMinNormal1 ) // normal
            {
        w |= ((MagU + (BiasDiffo+0x0FFF) + ((MagU>>13)&1))>>(23–cFractBits));
            }
    else            // denormal
        {
        UINT Fract = (MagU&((1<<23)–1)) | (1<<23); // implicit 1 now explicit
        int nshift = (eMin+127–(MagU>>23));
        Fract += ((Fract >> (nshift+23–cFractBits)) &1); //add 1 if even
        Fract += ((0x1000 <<nshift )–1);     //add rounding bias–1
        w |= (Fract>>(nshift+(23–cFractBits)));   // shift down
        }
    return w;
}
```

The comments in the section immediately above on strategies for SIMD implementation also apply to this section.

Shared Integer and Floating Point State (Pentium4/3DNow Observations)

The Pentium4 implements an extension to SSE1 that enables the 128-bit registers to be considered as MMX-style packed integers as well as packed single-precision floating point values. This extension can be used to good effect to implement faster versions of most of the algorithms described in this document. Since the registers can be considered as double-wide MMX registers, the algorithms that leverage MMX can be reimplemented on Pentium4 to perform twice as many conversions per instruction sequence. The algorithm described in section entitled "Compute Denormal Fraction Conditionally" would benefit particularly from a Pentium4 implementation because the Pentium4 can compute a mask that reflects the denormal condition in-place, rather than using the maskmove instruction and a lookup to transfer SSE1 register state into an MMX register.

tions, although those solutions pollute the cache and allow only one conversion to be performed at a time. The invention contemplates the use of several lookup-based algorithms as well as computational algorithms that lend themselves to SIMD implementation.

A pervasive issue in performing conversion between Float16 and Float32 is that of floating point versus integer state.

Basic Computational Approach

Listing 4-1 gives a basic computational method for converting a Float16 (that can contain a denormal) to Float32. The exponent is extracted; if equal to $e_{Min}-1$, the input value is a denormal and must be treated accordingly. Otherwise, the fraction may be masked, shifted and OR'd into the output For denormals, the input value is converted from sign-magnitude form to two's complement, converted to float, then multiplied by $2^{e_{mn}-NumFractBits}$, where NumFractBits is the number of bits in the fraction. For example, if $e_{min}$ is –14 and there are 10 bits of fraction, the scaling factor is $2^{-24}=1/16777216$.

Listing 4-1. Basic Computational Float16 to Float32 Conversion

```
float
Float16::ConvertToFloat( ) const
{
    UINT Sign = (w&0x8000)<<16;
    WORD BiasedExp = (WORD) ((w>>(15-cExpBits))&((1<<cExpBits)-1));
    short Exp = BiasedExp - (short) cExpBias;
    WORD wFract = (WORD) (w&cFractMask);
    if( Exp == eMin-1 )
    {
        // denormal - treat as signed int and scale appropriately
        float ret = (float) wFract/((float) (1<<-(eMin-cFractBits)));
        if( Sign )
            ret = -ret;
        return ret;
    }
    UINT u = (Exp+127)<<(31-8);
    u |= Sign| ((UINT) wFract << (23-cFractBits));
    return *(float *) (&u);
}
```

Overview of Lookup Approaches

A 65,536-entry lookup table can be used to map a Float16 to a Float32, if a 256 Kbyte lookup table is deemed appropriate. Such a lookup table is of prohibitive size and does not use the cache efficiently due to poor locality.

A alternate option would be to look up the most significant few bits (sign and exponent) in a small lookup table, then shift and OR in the bits of the significand from the 16-bit float. Alternatively, a lookup could be performed separately on the significand bits and the result OR'd into the result of the first lookup operation.

Denormals can be dealt with by checking the exponent for 0 and using a lookup table to compute the significand bits to OR into the output. A lookup table could also be used to ascertain whether the value is a denormal, or to compute the base address of the lookup tables to use for the significand.

Finally, SIMD computations using packed integers may be used to do the addressing calculations for the lookups under certain conditions.

Table 4-1 gives the definitions of the lookup tables described above. The following sections describe different variations of this basic method of using lookup tables to convert Float16 to Float32.

TABLE 4-1

Definitions Used In Lookup Algorithms

| Name | Description | Definition |
| --- | --- | --- |
| cHighLUTEntries | Number of entries in the sign + exponent lookup table | (1 << (1 + cExpBits)) |
| cfractionLUTEntries | Number of entries in the fraction lookup tables | (1 << (15 - cExpBits)) |
| rgHighLUT | Lookup table for sign + exponent | DWORD rgHighLUT[cHighLUTEntries]; |
| rgpLUT | Lookup table for lookup table to use for fraction | LPDWORD rgpLUT[cHighLUTEntries]; |
| rgNormalLUT | Lookup table for fraction (normal values) | ((1 << (cExpBits - 1)) - 1) |
| rgDenormalLUT | Lookup table for fraction (denormal values) | DWORD rgNormalLUT[cFractionLUTEntries]; |

Listing 4-2 gives a function that initializes the just-described lookup tables 5 so they may be used by the algorithms given in the following sections.

Listing 4-2. Lookup Initialization Routine

```
void
InitializeLUT( )
{
    int i;
    __mm_empty( );
    for ( i = 0; 1 < cHighLUTEntries; i++ )
    {
        int Sign = i>>cExpBits;
        UINT BiasedExp = i&cExpMask;
        int Exp = BiasedExp - cExpBias;
        if( Exp == eMin-1 )
        {
            Exp = 0;
            rgbDenormal[i] = true;
        }
        else
        {
            Exp += 127;
            rgbDenormal[i] = false;
        }
        rgpLUT[i] = ( rgbDenormal[i] ) ? rgDenormalLUT :rgNormalLUT;
        rgHighLUT[i] = (Sign<<31) | (Exp<<23);
    }
    for ( i = 0; i < cFractionLUTEntries; i++ )
    {
        Float16 f16(0,0,i);
        float f = (float) f16;
        rgDenormalLUT[i] = *(DWORD *) (&f);
        rgNormalLUT[i] = i<<(23-cFractBits);
    }
}
```

Lookup Denormal Only

The first variant of lookup-based Float16 to Float32 conversion extracts the sign and exponent bits and checks the exponent to see whether the value is a denormal. If so, it looks up the corresponding fraction bits for the Float32 output value; otherwise, it masks and shifts the fraction bits from the input value into the output.

Listing 4-3. Lookup Denormal Only

```
float
Float16::ConvertToFloatLUT( ) const
{
    UINT iHighLUT = w>>cFractBits;
    DWORD dwOut = rgHighLUT[iHighLUT];
    if ( iHighLUT&(cHighLUTEntries/2-1) )
    {
        dwOut |= (w&cFractMask)<<(23-cFractBits);
    }
    else
    {
        dwOut |= rgDenormalLUT[w&cFractMask];
    }
    return *(float *) (&dwOut);
}
```

Lookup Whether Denormal

This routine performs exactly as Listing 4-3 except that it uses a lookup table to test whether the input value is a denormal.

Listing 4-4. Lookup Whether Denormal

```
float
Float16::ConvertToFloatLUT2( ) const
{
    UINT iHighLUT = w>>cFractBits;
    DWORD dwOut = rgHighLUT[iHighLUT];
    if ( rgbDenormal[iHighLUT] )
    {
        dwOut |= rgDenormalLUT[w&cFractMask];
    }
    else
    {
        dwOut |= (w&cFractMask)<<(23-cFractBits);
    }
    return *(float *) (&dwOut);
}
```

Lookup Normal and Denormal

This function uses different lookup tables for both normal and denormal values; it uses the rgbDenormal lookup table to decide which lookup table to use.

Listing 4-5. Lookup Normal and Denormal

```
float
Float16::ConvertToFloatLUT3( ) const
{
    UINT iHighLUT = w>>cFractBits;
    DWORD dwOut = rgHighLUT[iHighLUT];
```

Listing 4-5. Lookup Normal and Denormal

```
if ( rgbDenormal[iHighLUT] )
{
    dwOut |= rgDenormalLUT[w&cFractMask];
}
else
{
    dwOut |= rgNormalLUT[w&cFractMask];
}
return *(float *) (&dwOut);
}
```

Lookup the Lookup Table

This function uses a new lookup table that is akin to rgbDenormal, except that the elements of the table are pointers to the lookup table to use when OR'ing in the fraction bits of the output. Hence, a lookup is performed to get the base address of the table to use for the lookup of the fraction bits. This method has the advantage that it is easy to extend to account for special INF (infinity) and NaN (not a number) encodings, while

Listing 4-6. Lookup the lookup table

```
float
Float16::ConvertToFloatLUT4( ) const
{
    UINT iHighLUT = w>>cFractBits;
    DWORD dwOut = rgHighLUT[iHighLUT];
    dwOut |= rgpLUT[iHighLUT][w&cFractMask];
    return *(float *) (&dwOut);
}
```

Hybrid SIMD/LUT Approach

SIMD packed integer operations may be used to perform the addressing operations for multiple data elements in parallel. SIMD operations are used to perform the following steps on more than one input operand at a time.
    extract the sign and exponent
    check the exponent for zero (indicating a denormal)
    select the appropriate lookup table based on whether each value is a denormal
    generate the addresses for lookup by adding the offsets into the lookup table addresses Once the addresses have been computed using SIMD operations, they may be transferred to registers for dereferencing as pointers. In the specific case of the x86 architecture with MMX, MMX may be used to generate two 32-bit addresses at a time and the MOVD instruction may be used to transfer MMX state into 32-bit registers for dereferencing.

SIMD (Denormals Disallowed)

Besides cache usage, the lookup-based approaches for converting Float16 to Float32 suffer from another drawback: they are difficult to parallelize via SIMD operations. Since only one address can participate in an instruction at a time, a lookup-based solution can only convert one value at a time (although SIMD may be applied to the preceding addressing computations, as described in the section immediately above). A computational approach that is amenable to SIMD optimization would benefit from increased parallelism.

For non-denormal floating point values, the conversion may be performed as follows.

Copy the sign bit to the most significant bit of the output.

Copy the fraction bits to the most significant bits of the output fraction.

Extract the exponent, apply the bias to compute the unbiased exponent, then apply the bias of the output format (+127 in the case of IEEE 32-bit float) and copy the resulting value into the exponent field of the output. Usually these two operations (a subtraction and an addition) can be combined into a single operation on the input exponent value.

These operations may be done on multiple operands in parallel using packed integer operations such as those provided by MMX or SSE2. If the packed integer and floating point state is not shared, the conversion code can attempt to use "store forwarding" to transfer the output of the conversion from the packed integer state to the packed floating point state. Store forwarding is a feature on modern microprocessors that enables the output of a store to be transferred directly to the input of a fetch, provided the address and size of the two operands are the same. Store forwarding avoids the overhead of an actual round trip through the memory hierarchy (including the primary cache).

Listing 4-8 gives an implementation of the above-described algorithm targeted at SSE1 (i.e. no shared floating point and integer state).

Listing 4-8. SIMD (Normals Only)

```
void
Convert4ToFloat( float *pf, Float16 f16[4] )
{
    __m64 m64 = *(__m64 *) f16;
    static const __m64 SignMask64 = _mm_set1_pi16( (short) 0x8000 );
    __m64 Sign64 = _mm_and_si64( m64, SignMask64 );
    __m64 Sign64Mask = _mm_srai_pi16( m64, 15 );
    // Extract exponent from 16-bit float inputs
    static const __m64 Exp64Mask = _mm_set1_pi16( (1<<cExpBits)-1 );
    __m64 Exp64 = _mm_srli_pi16( m64, 15-cExpBits );
    Exp64 = _mm_and_si64( Exp64, Exp64Mask );
    // Exp64 = unbiased exponents
    // Get whether they are equal to zero (-> input is denormal or 0)
    __m64 Exp64Zero = _mm_cmpeq_pi16(_mm_setzero_si64( ), Exp64 );
    // Compute biased Float32 exponents
    static const __m64 Exp64Bias = _mm_set1_pi16( 127-cExpBias );
    __m64 F32Exp64 = _mm_add_pi16( Exp64, Exp64Bias );
    // Extract fraction bits from inputs
    static const __m64 Fract64Mask = _mm_set1_pi16( cFractMask );
    __m64 Fract64 = _mm_and_si64( m64, Fract64Mask );
```

Listing 4-8. SIMD (Normals Only)

```
const __m64 zero = __mm_setzero_si64( );
__m128 AnswerNoDenormal;
{
    // High 16-bit halves of the floats we intend to output
    __m64 SignExp64 = __mm_or_si64( Sign64,
        __mm_slli_pi16( F32Exp64, 16-9 ) );
    // mask out where Exp64 was equal to zero
    SignExp64 = __mm_andnot_si64( Exp64Zero, SignExp64 );
    const __m64 zero = __mm_setzero_si64( );
    __m64 Float32High = __mm_unpackhi_pi16( SignExp64, zero );
    __m64 Float32Low = __mm_unpacklo_pi16( SignExp64, zero );
    Float32High = __mm_slli_pi32( Float32High, 16 );
    Float32Low = __mm_slli_pi32( Float32Low, 16 );
    Fract64 = __mm_andnot_si64( Exp64Zero, Fract64 );
    __m64 Fract32High = __mm_unpackhi_pi16( Fract64, zero );
    __m64 Fract32Low = __mm_unpacklo_pi16( Fract64, zero );
    Fract32High = __mm_slli_pi32( Fract32High, 23-cFractBits );
    Fract32Low = __mm_slli_pi32( Fract32Low, 23-cFractBits );
    Float32High = __mm_or_si64( Float32High, Fract32High );
    Float32Low = __mm_or_si64( Float32Low, Fract32Low );
    AnswerNoDenormal = __mm_loadl_pi( AnswerNoDenormal, &Float32Low );
    AnswerNoDenormal = __mm_loadh_pi( AnswerNoDenormal, &Float32High );
}
__mm_storeu_ps( pf, AnswerNoDenormal );
}
```

SIMD (Denormals Allowed)

For Float16 to Float32 conversion, Float16 denormals typically can be represented with Float32 normals. Float16 denormals may be converted to Float32 as follows.

Convert the denormal value to a signed integer. The sign can be applied by replicating the sign bit through the word, then XOR'ing and subtracting that value from the denormal.

Perform an int→float conversion on the signed integer, then multiply by $2^{e_{min}-NumFractBits}$, where NumFractBits is the number of bits in the fraction. For example, if $e_{min}$ is −14 and there are 10 bits of fraction, the scaling factor is $2^{-24}=1/16777216$.

For a general conversion from Float16 to Float32 that can accommodate both normals and denormals, the conversion described in 5.2 and the conversion described above may both be performed. The outputs of those conversions must be masked according to whether the corresponding input is a denormal; and the final result is computed by OR'ing together the two masked conversion values.

Both conversions need only be done if some of the values are normals and some are denormals. As a result, one possible optimization would be to assess whether the normal or denormal conversion must be performed at all. Even for SIMD implementations, it may make sense to test whether all the values are normals or all the values are denormals in order to avoid performing one conversion or the other. The MOVMSK instruction or some variant could be used to transfer this state into a 32-bit register in compressed form, and perform further tests or a computed branch to avoid unnecessary computation.

Listing 4-9 gives code that implements the Float16 to Float32 conversion on SSE1, without any conditional branches. Both answers (normal and denormal) are computed, masked appropriately and then OR'd together for the final answer.

Listing 4-9. SIMD Float16 to Float32 Conversion (Denormals Allowed)

```
__declspec(align(16)) static __m128 DenormalScale =
    { 1.0f/((float)(1<<-(eMin-cFractBits))),
      1.0f/((float)(1<<-(eMin-cFractBits))),
      1.0f/((float)(1<<-(eMin-cFractBits))),
      1.0f/((float)(1<<-(eMin-cFractBits)))
    };
void
Convert4ToFloat( float *pf, Float16 f16[4] )
{
    __m64 m64 = *(__m64 *) f16;
    static const __m64 SignMask64 = __mm_set1_pi16( (short) 0x8000 );
    __m64 Sign64 = __mm_and_si64( m64, SignMask64 );
    __m64 Sign64Mask = __mm_srai_pi16( m64, 15 );
    // Extract exponent from 16-bit float inputs
    static const __m64 Exp64Mask = __mm_set1_pi16( (1<<cExpBits)-1 );
    __m64 Exp64 = __mm_srli_pi16( m64, 15-cExpBits );
    Exp64 = __mm_and_si64( Exp64, Exp64Mask );
    // Exp64 = unbiased exponents
    // Get whether they are equal to zero (-> input is denormal or 0)
```

-continued

Listing 4-9. SIMD Float16 to Float32 Conversion (Denormals Allowed)

```
    __m64 Exp64Zero = __mm_cmpeq_pi16(__mm_setzero_si64( ), Exp64 );
    // Compute biased Float32 exponents
    static const __m64 Exp64Bias = __mm_set1_pi16( 127-cExpBias );
    __m64 F32Exp64 = __mm_add_pi16( Exp64, Exp64Bias );
    // Extract fraction bits from inputs
    static const __m64 Fract64Mask = __mm_set1_pi16( cFractMask );
    __m64 Fract64 = __mm_and_si64( m64, Fract64Mask );
    const __m64 zero = __mm_setzero_si64( );
    __m128 AnswerDenormal;
    {
        // Incorporate sign before conversion to int
        __m64 SignedDenormal = __mm_xor_si64( Fract64, Sign64Mask );
        SignedDenormal = __mm_sub_pi16( SignedDenormal, Sign64Mask );
        // Mask out where Exp64 was not equal to zero
        SignedDenormal = __mm_and_si64( SignedDenormal, Exp64Zero );
        // Convert to int
        __m64 F32Low = __mm_unpacklo_pi16( zero, SignedDenormal );
        F32Low = __mm_srai_pi32( F32Low, 16 );
        __m64 F32High = __mm_unpackhi_pi16( zero, SignedDenormal );
        F32High = __mm_srai_pi32( F32High, 16 );
        __m128 DenormalHigh = __mm_cvtpi32_ps(__mm_setzero_ps( ), F32Low );
        __m128 DenormalLow = __mm_cvtpi32_ps(__mm_setzero_ps( ), F32High );
        AnswerDenormal = __mm_shuffle_ps( DenormalHigh, DenormalLow,
    _MM_SHUFFLE(1,0,1,0) );
        AnswerDenormal = __mm_mul_ps( AnswerDenormal, DenormalScale );
    }
    __m128 AnswerNoDenormal;
    {
        // High 16-bit halves of the floats we intend to output
        __m64 SignExp64 = __mm_or_si64( Sign64,
                __mm_slli_pi16( F32Exp64, 16-9 ) );
        // mask out where Exp64 was equal to zero
        SignExp64 = __mm_andnot_si64( Exp64Zero, SignExp64 );
        const __m64 zero = __mm_setzero_si64( );
        __m64 Float32High = __mm_unpackhi_pi16( SignExp64, zero );
        __m64 Float32Low = __mm_unpacklo_pi16( SignExp64, zero );
        Float32High = __mm_slli_pi32( Float32High, 16 );
        Float32Low = __mm_slli_pi32( Float32Low, 16 );
        Fract64 = __mm_andnot_si64( Exp64Zero, Fract64 );
        __m64 Fract32High = __mm_unpackhi_pi16( Fract64, zero );
        __m64 Fract32Low = __mm_unpacklo_pi16( Fract64, zero );
        Fract32High = __mm_slli_pi32( Fract32High, 23-cFractBits );
        Fract32Low = __mm_slli_pi32( Fract32Low, 23-cFractBits );
        Float32High = __mm_or_si64( Float32High, Fract32High );
        Float32Low = __mm_or_si64( Float32Low, Fract32Low );
        AnswerNoDenormal = __mm_loadl_pi( AnswerNoDenormal, &Float32Low );
        AnswerNoDenormal = __mm_loadh_pi( AnswerNoDenormal, &Float32High );
    }
    __m128 Answer = __mm_or_ps( AnswerNoDenormal, AnswerDenormal );
    __mm_storeu_ps( pf, Answer );
}
```

Shared Integer and Floating Point State (Pentium4/3DNow Observations)

As with conversion from Float32 to Float16, the algorithms for Float16 to Float32 are more readily implementable if the packed integer and packed floating point state is shared, as with the Pentium4 ("Willamette") or 3DNow architectures from Intel and AMD, respectively. Packed integer operations may be used to shift, mask and OR together the output values and to generate masks that reflect whether the input values are denormals; packed floating point operations may be used to deal with denormal input values. Although SSE1 enables logical operations on floating point values, the values must be shifted and adjusted for different exponent biases using integer math operations. Hence, the algorithms outlined above are likely to significantly benefit from architectures with shared integer and floating point state.

What is claimed is:

1. A method for using a microprocessor's native floating point instructions to manipulate 16-bit floating point data representations, comprising:
   providing a 16-bit floating point data representation having a sign bit, an exponent and a significand;
   converting the 16-bit floating point data representation into a floating point format native to the microprocessor where the native floating point format is at least 32 bits;
   performing an operation on the native floating point representation using at least one of the microprocessors floating point instructions; and converting the native floating point data representation into a 16-bit floating point data representation by scaling the significand by a predetermined scaling factor and subtracting a constant from the exponent, whereby an image processing application in the microprocessor can manipulate the 16-bit floating point representation.

2. The method as recited in claim 1 wherein the 16-bit data representation represents information for use in image processing.

3. The method as recited in claim 2 wherein the information comprises color information.

4. The method as recited in claim 3 wherein the color information comprises transparency information.

5. The method recited in claim 2 wherein the information comprises spacial coordinates.

6. The method as recited in claim 2 wherein the information comprises texture image data.

7. The method as recited in claim 2 wherein the information comprises texture coordinates.

8. The method as recited in claim 2 wherein the information comprises displacement maps.

9. The method as recited in claim 2 wherein the information comprises bump maps.

10. The method as recited in claim 2 wherein the information comprises vertex information that controls graphics hardware.

11. The method as recited in claim 10 wherein the vertex information comprises joint interpolation data.

12. The method as recited in claim 1 wherein the step of converting the native floating point representation to a 16-bit floating point value comprises rounding the native floating point value to a 16-bit floating point value.

13. The method as recited in claim 12 wherein the rounding comprises clamping values above the maximum representable 16-bit floating point value to infinity.

14. The method as recited in claim 12 wherein the rounding comprises clamping values below the minimum representable 16-bit floating point value to zero.

15. The method as recited in claim 12 wherein the significand is rounded to nearest representable 16-bit floating point number.

16. The method as recited in claim 12 wherein the rounding is performed using SIMD instructions.

17. The method as recited in claim 16 wherein the SIMD instructions are selected from the set consisting of integer or floating point SIMD instructions.

18. The method as recited in claim 12 wherein the significand is rounded to the nearest even representable 16-bit floating point number.

19. The method as recited in claim 12 wherein the rounding is performed using integer instructions.

20. The method as recited in claim 12 wherein the rounding is performed using floating point instructions.

21. The method as recited in claim 1 wherein the 16-bit floating point data representation is biased by $2^{e-1}-1$ where e is an exponent whereby the exponent of zero lies proximate the middle of a range of exponent values.

22. The method as recited in claim 1 wherein the 16-bit floating point data representation has an exponent biased selected such that a range of values represented by the floating point number is between about zero and one.

23. The method as recited in claim 1 wherein the 16-bit floating point data representation definition such that an exponent e value of $2^e-1$ represent NaN values.

24. The method as recited in claim 1 wherein the native floating point data representation is a 32-bit floating point data representation.

25. The method as recited in claim 1 wherein the step of converting the 16-bit floating point value to a native floating point representation to a comprises providing a lookup table having the conversion from 16-bit floating point to native floating point.

26. The method as recited in claim 25 wherein a lookup table is provided for converting the sign and exponent of the 16-bit floating point value into the native floating point sign and exponent.

27. The method as recited in claim 1 wherein the step of converting the native floating point representation to a 16-bit floating point value comprises flushing 16-bit denormals are Flushed To Zero.

28. The method of claim 1 wherein (16-bit) denormals are generated by converting a scaled float to an integer using rounded float-to-integer conversion instruction.

29. The method of claim 1, wherein (16-bit) denormals are generated by using addition of $3*2^4 X$ (where X depends on the precise format) to cause all irrelevant bits to drop off the right end (but cause rounding), leaving the relevant bits at the bottom of the floating-point value ready to be used as an integer value.

30. The method of claim 1, where the logic for (16-bit) normals and denormals are both exercised, and a bit-mask is computed to select between them.

31. The method of claim 1, wherein denormal conversion is avoided when all the values in a region of memory convert to (16-bit) normals.

32. A computer-readable medium bearing computer-readable instructions for carrying out the steps recited in claim 1.

33. A method for using a microprocessor's native floating point instructions to manipulate 16-bit floating point data representations, comprising:
  providing a 16-bit floating point data representation having a sign bit, an exponent and a significand;
  converting the 16-bit floating point data representation into a floating point format native to the microprocessor where the native floating point format is at least 32 bits; and
  performing an operation on the native floating point representation using at least one of the microprocessors floating point instructions; and
  converting the native floating point representation to a 16-bit floating point value comprises rounding the native floating point value to a 16-bit floating point value by scaling the significand by a predetermined scaling factor and subtracting a constant from the exponent, whereby an image processing application in the microprocessor can manipulate the 16-bit floating point representation.

34. The method as recited in claim 33 wherein the 16-bit data representation represents information for use in image processing.

35. The method as recited in claim 34 wherein the information comprises color information.

36. The method as recited in claim 35 wherein the color information comprises transparency information.

37. The method recited in claim 34 wherein the information comprises spacial coordinates.

38. The method as recited in claim 34 wherein the information comprises texture mapping information.

39. The method as recited in claim 34 wherein the information comprises texture image data.

40. The method as recited in claim 34 wherein the information comprises texture coordinates.

41. The method as recited in claim 34 wherein the information comprises displacement maps.

42. The method as recited in claim 34 wherein the information comprises bump maps.

43. The method as recited in claim 34 wherein the information comprises vertex information that controls graphics hardware.

44. The method as recited in claim 43 wherein the vertex information comprises joint interpolation data.

45. The method as recited in claim 33 wherein the step of converting the native floating point representation to a 16-bit floating point value comprises rounding the native floating point value to a 16-bit floating point value.

46. The method as recited in claim 45 wherein the rounding comprises clamping values above the maximum representable 16-bit floating point value to infinity.

47. The method as recited in claim 45 wherein the rounding comprises clamping values below the minimum representable 16-bit floating point value to zero.

48. The method as recited in claim 45 wherein the significand is rounded to nearest representable 16-bit floating point number.

49. The method as recited in claim 45 wherein the significand is rounded to the nearest even representable 16-bit floating point number.

50. The method as recited in claim 45 wherein the rounding is performed using integer instructions.

51. The method as recited in claim 45 wherein the rounding is performed using floating point instructions.

52. The method as recited in claim 45 wherein the rounding is performed using SIMD instructions.

53. The method as recited in claim 52 wherein the SIMD instructions are selected from the set consisting of integer or floating point SIMD instructions.

54. The method as recited in claim 33 wherein the 16-bit floating point data representation is biased by $2^{e-1}-1$ whereby the exponent of zero lies proximate the middle of a range of exponent values.

55. The method as recited in claim 33 wherein the 16-bit floating point data representation has an exponent biased selected such that a range of values represented by the floating point number is between about zero and one.

56. The method as recited in claim 33 wherein the 16-bit floating point data representation definition such that an exponent value of $2^e-1$ represent NaN values.

57. The method as recited in claim 33 wherein the native floating point data representation is a 32-bit floating point data representation.

58. A computer-readable medium bearing computer-readable instructions for carrying out the steps recited in claim 33.

59. A computer-based method for using a native microprocessor floating-point instructions set, comprising:
providing information in a native floating point format where the native floating point format is at least 32 bits;
providing a 16-bit floating point data representation having a sign bit, an exponent and a significand;
performing an operation on the information in the native floating point format; and
converting the information in the native bit floating point format into the 16-bit floating point format by scaling the significand by a predetermined scaling factor and subtracting a constant from the exponent, whereby an image processing application in the microprocessor can manipulate the 16-bit floating point representation.

60. The method as recited in claim 59 wherein the 16-bit data representation represents information for use in image processing.

61. The method as recited in claim 60 wherein the information comprises color information.

62. The method as recited in claim 61 wherein the color information comprises transparency information.

63. The method recited in claim 60 wherein the information comprises special coordinates.

64. The method as recited in claim 60 wherein the information comprises texture mapping information.

65. The method as recited in claim 60 wherein the information comprises texture image data.

66. The method as recited in claim 60 wherein the information comprises texture coordinates.

67. The method as recited in claim 60 wherein the information comprises displacement maps.

68. The method as recited in claim 60 wherein the information comprises bump maps.

69. The method as recited in claim 60 wherein the information comprises vertex information that controls graphics hardware.

70. The method as recited in claim 69 wherein the vertex information comprises joint interpolation data.

71. The method as recited in claim 59 wherein the 16-bit floating point data representation definition is such that an exponent value of $2^{e-1}$ represents NaN values.

72. The method as recited in claim 59 wherein the native floating point data representation is a 32-bit floating point data representation.

73. A computer-readable medium bearing computer-readable instructions for carrying out the steps recited in claim 59.

74. The method as recited in claim 59 wherein the conversion from 16-bit floating point to native floating point is performed by use of a lookup table.

75. The method as recited in claim 74 wherein the lookup table is indexed on a portion of the 16-bit floating point number.

76. The method as recited in claim 75 wherein the portion comprises the exponent.

77. The method as recited in claim 74 wherein the lookup table is used to determine whether the floating point value is a denormal value.

78. The method as recited in claim 59 wherein the conversion from 16-bit floating point to native floating point representation is performed using SIMD instructions.

79. A method for use in an image processing application using a microprocessor's native floating point instructions to manipulate floating point data representations, comprising:
providing a native floating point data representation having a sign bit, an exponent and a significand;
performing an operation on the native floating point representation using at least one of the microprocessors floating point instructions;
converting the native floating point data representation into a 16-bit floating point data representation by scaling the significand by a predetermined scaling factor and subtracting a constant from the exponent, whereby an image processing application can manipulate the 16-bit floating point representation;
performing an operation on the 16-bit floating point data; and
converting the 16-bit floating point data representation into a floating point format native to the microprocessor where the native floating point format is at least 32 bits.

80. The method as recited in claim 79 wherein the 16-bit data representation represents information for use in image processing.

81. The method as recited in claim 80 wherein the information comprises color information.

82. The method as recited in claim 81 wherein the color information comprises transparency information.

83. The method recited in claim 80 wherein the information comprises special coordinates.

84. The method as recited in claim 80 wherein the information comprises texture image data.

85. The method as recited in claim 80 wherein the information comprises texture coordinates.

86. The method as recited in claim 80 wherein the information comprises displacement maps.

87. The method as recited in claim 80 wherein the information comprises bump maps.

88. The method as recited in claim 80 wherein the information comprises vertex information that controls graphics hardware.

89. The method as recited in claim 88 wherein the vertex information comprises joint interpolation data.

90. The method as recited in claim 79 wherein the 16-bit floating point data representation is biased by $2^{e-1}-1$ where e is an exponent whereby the exponent of zero lies proximate the middle of a range of exponent values.

91. The method as recited in claim 79 wherein the 16-bit floating point data representation has an exponent biased selected such that a range of values represented by the floating point number is between about zero and one.

92. The method as recited in claim 79 wherein the 16-bit floating point data representation definition such that an exponent e value of $2^{e-1}$ represent NaN values.

93. The method as recited in claim 79 wherein the native floating point data representation is a 32-bit floating point data representation.

94. The method as recited in claim 79 wherein the step of converting the 16-bit floating point value to a native floating point representation comprises providing a lookup table having the conversion from 16-bit floating point to native floating point.

95. The method as recited in claim 94 wherein the lookup table is indexed on a portion of the 16-bit floating point number.

96. The method as recited in claim 95 wherein the portion comprises the exponent.

97. The method as recited in claim 95 wherein the lookup table is used to determine whether the floating point value is a denormal value.

98. The method as recited in claim 79 wherein the conversion from 16-bit floating point to native floating point representation is performed using SIMD instructions.

99. A computer-readable medium bearing computer-readable instructions for carrying out the steps recited in claim 79.

100. An apparatus for manipulating 16-bit floating point data representations, comprising:

conversion means for converting a 16-bit floating point data representation having a sign bit, an exponent, and a significand into a floating point format native to the microprocessor where the native floating point format is at least 32 bits;

a microprocessor for performing an operation on the native floating point representation using at least one of the microprocessors floating point instructions; and means for converting the native floating point data representation into a 16-bit floating point data representation by scaling the significand by a predetermined scaling factor and subtracting a constant from the exponent, whereby an image processing application in the microprocessor can manipulate the 16-bit floating point representation.

101. The apparatus as recited in claim 100 wherein the 16-bit data representation represents information for use in image processing.

102. An apparatus for use in an image processing application using floating-point instructions set, comprising:

a microprocessor for performing an operation on information in a native floating point format where the native floating point format is at least 32 bits; and converting the information in the native bit floating point format into a 16-bit floating point data representation having a sign bit, an exponent and a significant by scaling the significand by a predetermined scaling factor and subtracting a constant from the exponent, whereby an image processing application in the microprocessor can manipulate the 16-bit floating point representation.

103. The apparatus as recited in claim 102 wherein the 16-bit data representation represents information for use in image processing.

* * * * *